United States Patent
Hashizume et al.

(10) Patent No.: US 11,876,131 B2
(45) Date of Patent: Jan. 16, 2024

(54) SEMICONDUCTOR DEVICE

(71) Applicant: FUJI ELECTRIC CO., LTD., Kawasaki (JP)

(72) Inventors: Yuichi Hashizume, Matsumoto (JP); Keishirou Kumada, Matsumoto (JP); Yoshihisa Suzuki, Matsumoto (JP); Yasuyuki Hoshi, Matsumoto (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 393 days.

(21) Appl. No.: 16/366,379

(22) Filed: Mar. 27, 2019

(65) Prior Publication Data

US 2019/0371932 A1  Dec. 5, 2019

(30) Foreign Application Priority Data

May 29, 2018 (JP) ................. 2018-102844

(51) Int. Cl.
*H01L 29/78* (2006.01)
*H01L 29/66* (2006.01)
(Continued)

(52) U.S. Cl.
CPC ...... *H01L 29/7804* (2013.01); *H01L 29/1608* (2013.01); *H01L 29/45* (2013.01); *H01L 29/66992* (2013.01); *H01L 29/7813* (2013.01)

(58) Field of Classification Search
CPC ................. H01L 29/1608; H01L 29/45; H01L 29/66992; H01L 29/7804; H01L 29/7813;
(Continued)

(56) References Cited

U.S. PATENT DOCUMENTS

| 4,760,434 A * | 7/1988 | Tsuzuki | .................. H01L 23/34 |
| | | | 257/328 |
| 2013/0175549 A1* | 7/2013 | Okumura | ............ H01L 27/0255 |
| | | | 257/77 |

(Continued)

FOREIGN PATENT DOCUMENTS

| JP | 2017-079324 A | 4/2017 |
| WO | 2017042963 A1 | 3/2017 |
| WO | 2017208734 A1 | 12/2017 |

OTHER PUBLICATIONS

Office Action dated Mar. 1, 2022, for the corresponding Japanese patent application No. 2018-102844.

*Primary Examiner* — Meiya Li
(74) *Attorney, Agent, or Firm* — Rabin & Berdo, P.C.

(57) ABSTRACT

A source pad of a main semiconductor element is electrically connected to an $n^+$-type source region via a barrier metal. A temperature sensing part is a poly-silicon diode formed by a pn junction between a p-type poly-silicon layer that is a p-type anode region and an n-type poly-silicon layer that is an n-type cathode region. The temperature sensing part is provided, via the field insulating film, on a front surface of a same semiconductor substrate as the main semiconductor element. An anode pad and a cathode pad are in direct contact with the p-type poly-silicon layer and the n-type poly-silicon layer, respectively. The source pad, the anode pad, and the cathode pad are aluminum alloy films.

8 Claims, 11 Drawing Sheets

(51) Int. Cl.
*H01L 29/16* (2006.01)
*H01L 29/45* (2006.01)

(58) Field of Classification Search
CPC ............. H01L 29/0623; H01L 29/0657; H01L 29/0878; H01L 29/1095; H01L 29/16; H01L 29/401; H01L 29/41741; H01L 29/456; H01L 29/66068; H01L 29/66734; H01L 29/7811; H01L 29/7815; H01L 29/861
USPC .................................................. 257/365–369
See application file for complete search history.

(56) References Cited

U.S. PATENT DOCUMENTS

2017/0111037 A1\* 4/2017 Shiigi ................. H01L 21/4853
2017/0338336 A1\* 11/2017 Nasu ................... H01L 29/7813
2018/0277437 A1 9/2018 Yamada et al.

\* cited by examiner

SEMICONDUCTOR DEVICE

CROSS REFERENCE TO RELATED APPLICATIONS

This application is based upon and claims the benefit of priority of the prior Japanese Patent Application No. 2018-102844, filed on May 29, 2018, the entire contents of which are incorporated herein by reference.

BACKGROUND OF THE INVENTION

1. Field of the Invention

Embodiments of the invention relate to a semiconductor device.

2. Description of the Related Art

Semiconductor materials (hereinafter, wide bandgap semiconductor materials) having a bandgap that is wider than that of silicon (Si) are gaining attention as a semiconductor material enabling fabrication (manufacture) of next generation power semiconductor devices having excellent high-temperature characteristics, high-speed characteristics, and low ON voltage. Further, conventionally, in a power semiconductor device that uses a wide bandgap semiconductor material, a trench gate structure is adopted in a vertical metal oxide semiconductor field effect transistor (MOSFET) that is a switching device and includes an insulated gate constituted by a 3-layer structure including a metal, an oxide film, and a semiconductor.

In the trench gate structure, which is a MOS gate structure in which a MOS gate is embedded in a trench formed at a front surface of a semiconductor substrate (semiconductor chip), a channel (inversion layer) is formed along a side wall of the trench, in a direction orthogonal to the front surface of the semiconductor substrate. Therefore, this is advantageous in terms of cost since unit cell (element configuration unit) density per unit area may be increased and current density per unit area may be increased as compared to a planar gate structure in which a channel is formed along a front surface of a semiconductor substrate. A planar gate structure is a MOS gate structure in which a MOS gate is provided in a flat plate-like shape on the front surface of the semiconductor substrate.

Further, the rate of temperature increase corresponding to the unit-cell occupied volume increases the extent to which the current density of the device is increased and a problem such as peeling of bonding wires occurs, necessitating a double-sided cooling structure to achieve improvements in discharge rate and stabilizing reliability. A double-sided cooling structure is a structure having enhanced heat dissipation of the semiconductor substrate overall by dissipating heat to the outside from both sides of the semiconductor substrate, the heat generated by the semiconductor substrate. In the double-sided cooling structure, the heat generated by the semiconductor substrate is dissipated from a cooling fin in contact with a rear surface of the semiconductor substrate, via a metal base plate, and is dissipated from a metal bar, via a terminal pin having one end bonded to the front surface of the semiconductor substrate while the other end of the terminal pin is bonded to the metal bar.

To further improve the reliability of a device, on a single semiconductor substrate having a vertical MOSFET, which is a main semiconductor element, a silicon carbide semiconductor device has been proposed that has a high-performance structure in which a high-function part such as a temperature sensing part, an over-voltage protecting part, and a current sensing part is disposed as a circuit part for protecting and controlling the main semiconductor element (for example, refer to Japanese Laid-Open Patent Publication No. 2017-079324). In Japanese Laid-Open Patent Publication No. 2017-079324, to suppress decreases in reliability and contact failure of a contact (electrical contact) of an electrode pad and a semiconductor region formed to supply carriers to a channel of the vertical MOSFET that is a main semiconductor element, a barrier metal such as a titanium nitride (TiN) film, a titanium (Ti) film, etc. is formed between the semiconductor region and the electrode pad.

SUMMARY OF THE INVENTION

According to an embodiment of the present invention, a semiconductor device includes a semiconductor substrate of a first semiconductor type including a semiconductor material having a bandgap that is wider than that of silicon; a second-conductivity-type region of a second conductivity type provided in a surface layer of a first main surface of the semiconductor substrate; an insulated-gate field effect transistor using the second-conductivity-type region as a base region; a second-conductivity-type poly-silicon layer of the second conductivity type provided on the first main surface of the semiconductor substrate, via an insulating layer; a first-conductivity-type poly-silicon layer of the first conductivity type provided on the first main surface of the semiconductor substrate, via the insulating layer, the first-conductivity-type poly-silicon layer being in contact with the second-conductivity-type poly-silicon layer; a diode formed by a pn junction between the second-conductivity-type poly-silicon layer and the first-conductivity-type poly-silicon layer; a source pad of the insulated-gate field effect transistor, the source pad being electrically connected to the second-conductivity-type region; an anode pad of the diode, the anode pad being electrically connected to the second-conductivity-type poly-silicon layer; and a cathode pad of the diode, the cathode pad being electrically connected to the first-conductivity-type poly-silicon layer. The source pad is a metal film that contains aluminum as a main constituent, the source pad being electrically connected to the second-conductivity-type region via a barrier metal. The anode pad is a metal film containing aluminum as a main constituent, the anode pad being in direct contact with the second-conductivity-type poly-silicon layer.

In the embodiment, the cathode pad is a metal film containing aluminum as a main constituent, the cathode pad being in direct contact with the first-conductivity-type poly-silicon layer.

In the embodiment, the source pad is in direct contact with the first-conductivity-type poly-silicon layer and configures the cathode pad.

In the embodiment, the source pad is connected to the first-conductivity-type poly-silicon layer via the barrier metal and configures the cathode pad.

In the embodiment, the barrier metal is disposed partially between the cathode pad and the first-conductivity-type poly-silicon layer. The cathode pad and the first-conductivity-type poly-silicon layer are connected to each other at one portion thereof via the barrier metal, and at other portions thereof are in direct contact with each other.

In the embodiment, the barrier metal is any one of a titanium film, a titanium nitride film, and a stacked film of the titanium film and the titanium nitride.

In the embodiment, the cathode pad is grounded. A temperature of the insulated-gate field effect transistor is detected using temperature characteristics of the diode.

According to another embodiment of the present invention, a semiconductor device includes a semiconductor substrate of a first semiconductor type including a semiconductor material having a bandgap that is wider than that of silicon; a second-conductivity-type region of a second conductivity type provided in a surface layer of a first main surface of the semiconductor substrate; an insulated-gate field effect transistor using the second-conductivity-type region as a base region; one or more circuit parts for protecting or controlling the insulated-gate field effect transistor, the one or more circuit parts being provided on the semiconductor substrate; a poly-silicon layer provided on the first main surface of the semiconductor substrate via an insulating layer, the poly-silicon layer configuring the one or more circuit parts; a source pad of the insulated-gate field effect transistor, the source pad being electrically connected to the second-conductivity-type region; and an electrode pad electrically connected to the poly-silicon layer. The source pad is a metal film containing aluminum as a main constituent, the source pad being electrically connected to the second-conductivity-type region via a barrier metal. The electrode pad is a metal film containing aluminum as a main constituent, the electrode pad being in direct contact with the poly-silicon layer.

Objects, features, and advantages of the present invention are specifically set forth in or will become apparent from the following detailed description of the invention when read in conjunction with the accompanying drawings.

DETAILED DESCRIPTION OF THE INVENTION

Figure 1:
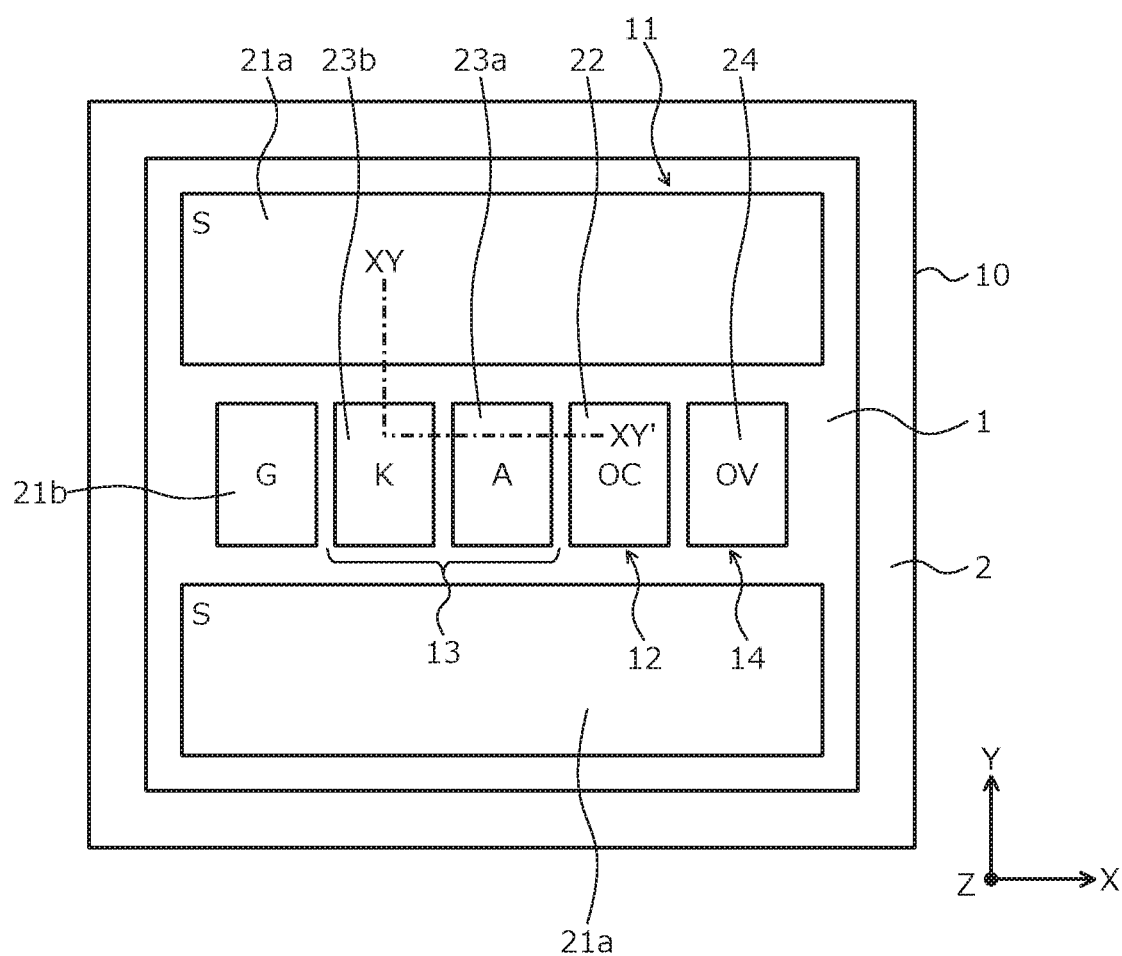
FIG. 1 is a plan view of an example of a layout of a semiconductor device according to a first embodiment as viewed from a front surface of a semiconductor substrate.

First, problems associated with the related arts will be described. In the semiconductor device having the high-performance structure described above, similarly to the main semiconductor element, a barrier metal is formed further at contacts of high-function parts such as the current sensing part, the temperature sensing part and the over-voltage protecting part, respectively. However, when a diode functioning as the temperature sensing part is constituted by a poly-silicon (poly-Si) layer deposited on the semiconductor substrate, adhesiveness between the barrier metal and the poly-silicon layer constituting the temperature sensing part decreases and a contact failure may occur in the temperature sensing part.

Embodiments of a semiconductor device according to the present invention will be described in detail with reference to the accompanying drawings. In the present description and accompanying drawings, layers and regions prefixed with n or p mean that majority carriers are electrons or holes. Additionally, + or – appended to n or p means that the impurity concentration is higher or lower, respectively, than layers and regions without + or –. In the description of the embodiments below and the accompanying drawings, main portions that are identical will be given the same reference numerals and will not be repeatedly described. Further, in the present description, when Miller indices are described, "–" means a bar added to an index immediately after the "–", and a negative index is expressed by prefixing "–" to the index.

Figure 2:
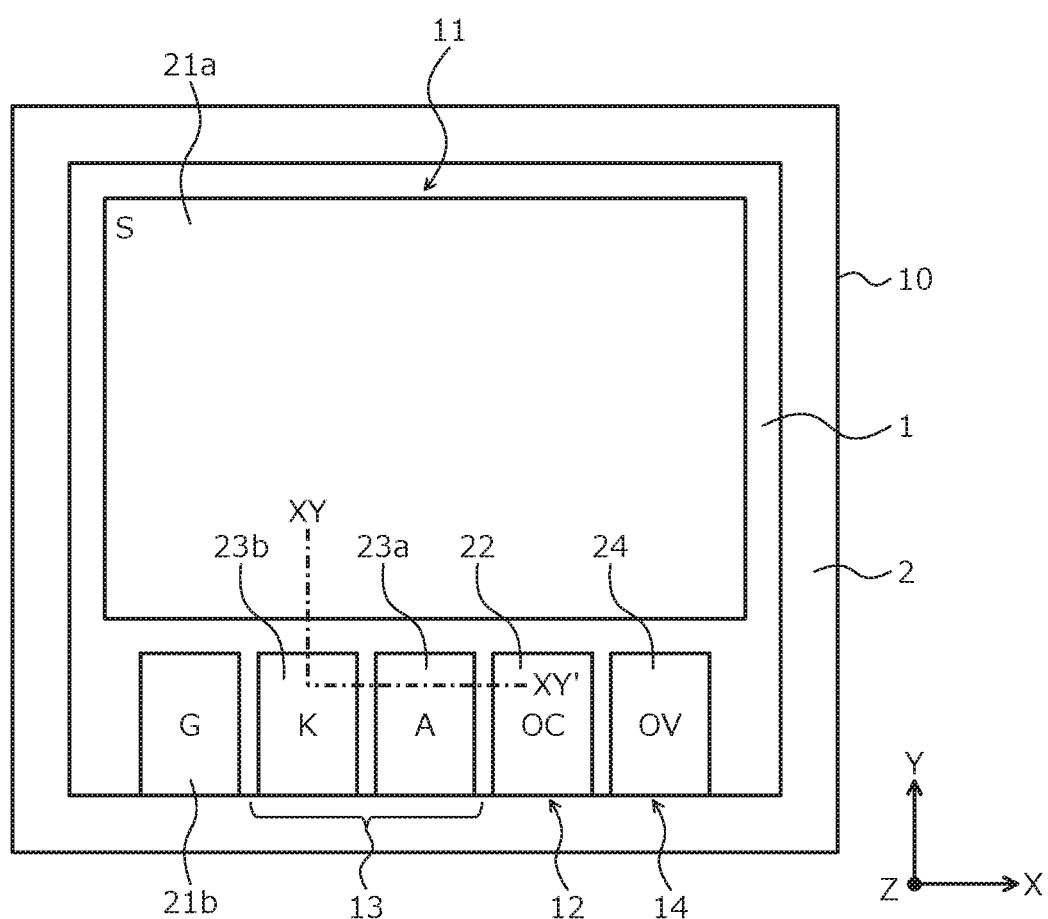
FIG. 2 is a plan view of another example of a layout of the semiconductor device according to the first embodiment as viewed from the front surface of the semiconductor substrate.

A semiconductor device according to a first embodiment is configured using, as a semiconductor material, a semiconductor material (hereinafter, wide bandgap semiconductor material) that has a bandgap that is wider than that of silicon (Si). A structure of the semiconductor device according to the first embodiment will be described taking, as an example, a case in which, for example, silicon carbide (SiC) is used as the wide bandgap semiconductor material. FIGS. 1 and 2 are plan views of examples of layouts of the semiconductor device according to the first embodiment as viewed from a front surface of a semiconductor substrate. FIGS. 1 and 2 each depicts a different example of a layout of an electrode pad of elements disposed in a semiconductor substrate (semiconductor chip) 10.

The semiconductor device according to the first embodiment depicted in FIG. 1 has a main semiconductor element 11 and one or more circuit parts for protecting/controlling the main semiconductor element 11, in an active region 1 of the single semiconductor substrate 10 that contains silicon carbide. The main semiconductor element 11 is a vertical MOSFET through which drift current flows in a vertical direction (a depth direction Z of the semiconductor substrate 10) during an ON state; is configured by plural unit cells (functional units: not depicted) disposed adjacently; and performs a main operation. A high-function part such as, for example, a current sensing part 12, a temperature sensing part 13, an over-voltage protecting part 14, and a calculation circuit part (not depicted) may be given as examples of a circuit part for protecting/controlling the main semiconductor element 11.

The active region 1 is a region in which main current flows when the main semiconductor element 11 is ON, and a periphery of the active region 1 is surrounded by an edge termination region 2. The edge termination region 2 is a region between the active region 1 and a side surface of the semiconductor substrate 10. The edge termination region 2 is a region that is for mitigating electric field on a front surface side of the semiconductor substrate 10 and sustaining a breakdown voltage (withstand voltage). In the edge termination region 2, for example, a breakdown voltage structure (not depicted) such as a p-type region that constitutes a junction termination extension (JTE) structure, a guard ring, a field plate, RESURF, etc. is disposed. The breakdown voltage is a voltage limit at which no errant operation or destruction of an element occurs.

In the active region 1, on the front surface of the semiconductor substrate 10, a source pad (electrode pad) 21a of the main semiconductor element 11 and electrode pads of the circuit parts for protecting/controlling the main semiconductor element 11 are provided separated from each other. The main semiconductor element 11 has a large current capability as compared to other circuit parts. Therefore, the source pad 21a of the main semiconductor element 11 covers substantially an entire surface of the active region 1, excluding a region where the electrode pads other than the source pad 21a are disposed. A planar layout of the source pad 21a may be variously modified according to required specifications and, for example, is determined by the current capability of the main semiconductor element 11.

For example, when the electrode pads other than the source pad 21a are disposed in a single linear row in a central part of the active region 1, two of the source pads 21a may be disposed opposing each other sandwiching all of the electrode pads other than the source pads 21a (FIG. 1). For example, when the electrode pads other than the source pads 21a are disposed in a single linear row along a border of the active region 1 and the edge termination region 2, a single source pad 21a may be disposed on substantially an entire surface of the active region 1 excluding a region where the electrode pads other than the source pad 21a are disposed (FIG. 2). The source pad 21a of the main semiconductor element 11, for example, has a rectangular planar shape.

The current sensing part 12 has a function of detecting over current (OC) flowing in the main semiconductor element 11. The current sensing part 12 is a vertical MOSFET that has unit cells that have a same configuration as the main semiconductor element 11 and that are of a number (for example, about 10 to 20) fewer than the number (for example, about 10,000) of the unit cells of the main semiconductor element 11. The current sensing part 12 operates under the same conditions as the main semiconductor element 11. The current sensing part 12, for example, may be configured using some of the unit cells of the main semiconductor element 11. An electrode pad (hereinafter, OC pad) 22 of the current sensing part 12 is disposed in an effective region (region functioning as a MOS gate) in the active region 1.

The temperature sensing part 13 has a function of detecting a temperature of the main semiconductor element 11, using temperature characteristics of a diode. For example, a p-type anode region (not depicted) of the temperature sensing part 13 is disposed in the central part of the active region 1 in a substantially circular planar shape, and an n cathode region (not depicted) has a substantially annular planar shape surrounding a periphery of the p-type anode region. The over-voltage protecting part 14, for example, is a diode that protects the main semiconductor element 11 from over voltage (OV) such as surges. The current sensing part 12, the temperature sensing part 13, and the over-voltage protecting part 14 are controlled by the calculation circuit part and based on output signals of these parts, the main semiconductor element 11 is controlled.

Electrode pads other than the source pad 21a and the OC pad 22 may be disposed in a non-operating region (region not used as MOS gate) in the active region 1. The electrode pads other than the source pad 21a and the OC pad 22 are a gate pad 21b of the main semiconductor element 11, electrode pads (hereinafter, anode pad and cathode pad) 23a, 23b of the temperature sensing part 13, an electrode pad (hereinafter, OV pad) 24 of the over-voltage protecting part 14, and an electrode pad (hereinafter, calculating part pad: not depicted) of the calculation circuit part. The gate pad 21b of the main semiconductor element 11 may be disposed in the edge termination region 2.

The OV pad 24, the anode pad 23a, and the cathode pad 23b may be disposed in an element structure of the over-voltage protecting part 14 and an element structure of the temperature sensing part 13 as well as in the edge termination region 2. The anode pad 23a and the cathode pad 23b may be disposed near a region of the main semiconductor element 11 having a large amount of current (for example, the central part of the active region 1). In FIGS. 1 and 2, the source pad 21a, the gate pad 21b, the OC pad 22, the anode pad 23a, the cathode pad 23b, and the OV pad 24 are depicted having rectangular planar shapes affixed with S, G, OC, A, K, and OV, respectively.

The calculation circuit part is configured by plural semiconductor elements such as complementary MOS (CMOS) circuits. Therefore, the calculation circuit part includes the calculating part pad in addition to front electrodes (source electrodes, etc.: not depicted) of the plural semiconductor elements configuring the calculation circuit part. When the calculation circuit part is disposed on the same semiconductor substrate 10 as the main semiconductor element 11, element structures (including the front electrodes) of the plural semiconductor elements configuring the calculation circuit part suffice to be disposed in the effective region of the active region 1. The calculating part pad may be disposed in the effective region and/or the non-operating region of the active region 1 and may be further disposed in the edge termination region 2.

Figure 3:
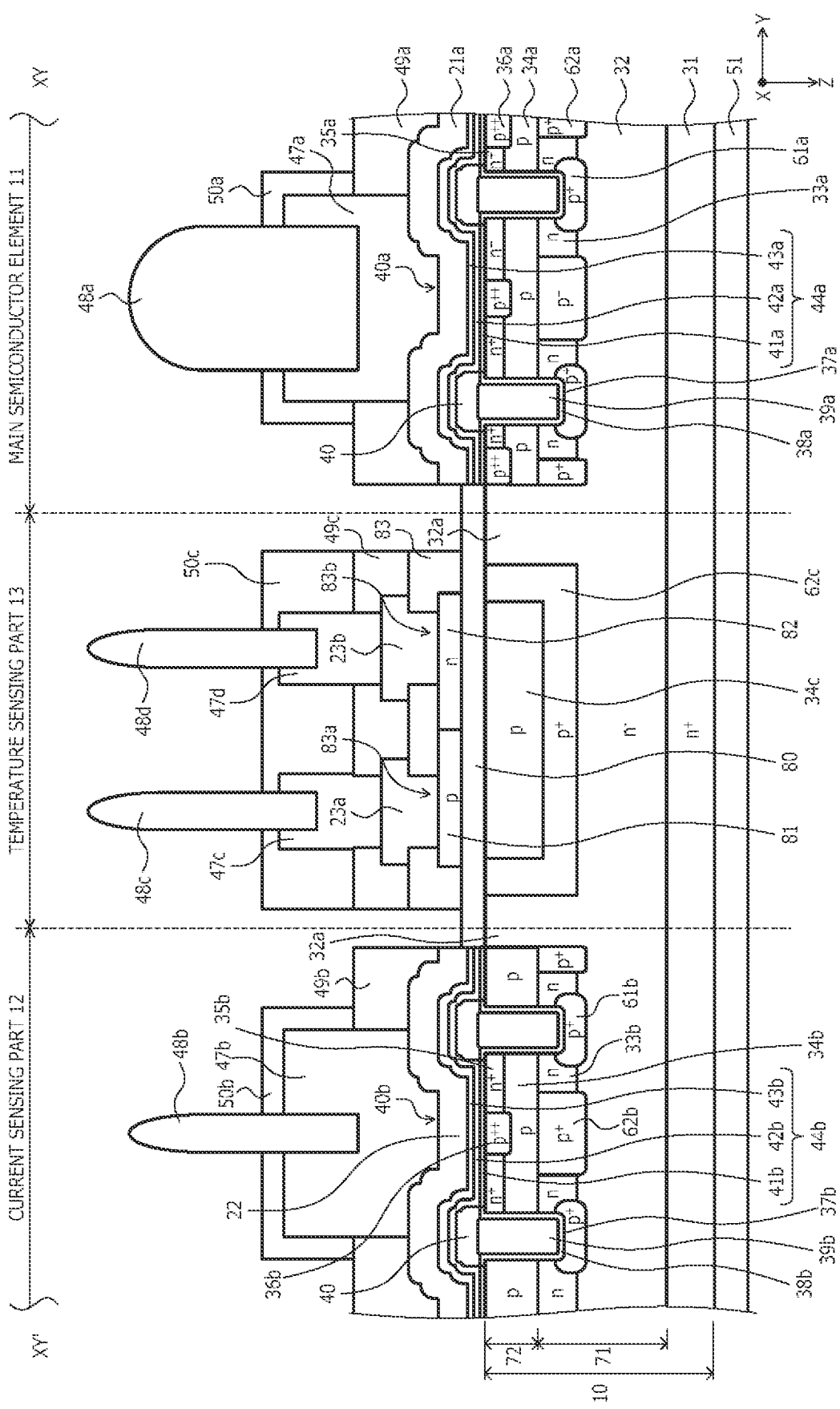
FIG. 3 is a cross-sectional view of a structure along cutting line XY-XY' in FIGS. 1 and 2.

An example of a cross-section of a structure of the main semiconductor element 11, the current sensing part 12, and the temperature sensing part 13 above will be described. The main semiconductor element 11 and the circuit part that protects/controls the main semiconductor element 11 have a wiring structure of a same configuration using wiring members (terminal pins 48a to 48d described hereinafter) that have a pin-shape. FIG. 3 is a cross-sectional view of the structure along cutting line XY-XY' in FIGS. 1 and 2. FIG. 3 depicts a cross-section of the structure along cutting line XY-XY' that, from the source pad 21a of the active region 1 in FIG. 1, passes through the cathode pad 23b and the anode pad 23a and leads to the OC pad 22.

The main semiconductor element 11 is a vertical MOSFET that has a MOS gate of a trench gate structure on the front surface side of the semiconductor substrate 10. The semiconductor substrate 10 is an epitaxial substrate in which an $n^-$-type silicon carbide layer 71 and a p-type silicon carbide layer 72 are sequentially formed by epitaxial growth on an $n^+$-type starting substrate 31 that contains silicon carbide. The MOS gate of the main semiconductor element 11 is configured by a p-type base region 34a, an n+-type source region 35a, a p++-type contact region 36a, a trench 37a, a gate insulating film 38a, and a gate electrode 39a.

Parts of the MOS gate of the main semiconductor element 11 are provided in a formation region of the main semiconductor element 11 in the active region 1. The trench 37a penetrates the p-type silicon carbide layer 72 in the depth direction from the front surface (surface of the p-type silicon carbide layer 72) of the semiconductor substrate 10 and reaches the n−-type silicon carbide layer 71. The depth direction Z is a direction from the front surface of the semiconductor substrate 10 toward a rear surface. In a region in which the main semiconductor element 11 is disposed, a portion of the p-type silicon carbide layer 72 is the p-type base region 34a, the portion being between adjacent trenches 37a.

The trench 37a, for example, is disposed in a striped shape (not depicted) extending along a direction (refer to FIG. 1: hereinafter, first direction) X that is parallel to the front surface of the semiconductor substrate 10 and along which the electrode pads 21b, 23b, 23a, 22, and 24 are arranged, or a direction (hereinafter, second direction) Y orthogonal to the first direction X. The trench 37a, for example, may be disposed in a matrix-shape as viewed from the front surface of the semiconductor substrate 10.

In the trench 37a, the gate electrode 39a is provided via the gate insulating film 38a. One unit cell of the main semiconductor element 11 is configured by the gate electrode 39a disposed in one trench 37a and regions (mesa regions) sandwiched between adjacent trenches 37a that sandwich the gate electrode 39a disposed in the one trench 37a. In FIG. 3, of the plural unit cells of the main semiconductor element 11, only two of the unit cells are depicted (similarly in FIGS. 11 and 13).

In a surface layer on a source side (side facing toward the source pad 21a) of the n−-type silicon carbide layer 71, an n-type region (hereinafter, n-type current diffusion region) 33a is provided. The n-type current diffusion region 33a is in contact with the p-type base region 34a. The n-type current diffusion region 33a is a so-called current spreading layer (CSL) that reduces carrier spreading resistance. The n-type current diffusion region 33a, for example, is provided uniformly along a direction parallel to the front surface of the semiconductor substrate 10 so as to partially constitute an inner wall of the trench 37a.

The n-type current diffusion region 33a, from an interface thereof with the p-type base region 34a, reaches a position that is closer to a drain (a drain electrode 51) than is a position of a bottom of the trench 37a. In the n-type current diffusion region 33a, first and second p+-type regions 61a, 62a may each be selectively provided separated from each other. An application of high electric field to the gate insulating film 38a at the bottom of the trench 37a may be prevented by the first and the second p+-type regions 61a, 62a.

Of the bottom and a bottom corner part of the trench 37a, the first p+-type region 61a contacts at least the bottom. The bottom corner part of the trench 37a is a border of the bottom and a side wall of the trench 37a. Further, the first p+-type region 61a is disposed at a position that is closer to the drain than is a position of an interface of the p-type base region 34a and the n-type current diffusion region 33a, the first p+-type region 61a being disposed separated from the p-type base region 34a. The second p+-type region 62a is provided between (mesa region) the adjacent trenches 37a, the second p+-type region 62a being separated from the first p+-type regions 61a and the trenches 37a, and in contact with the p-type base region 34a.

Pn junctions of the first and the second p+-type regions 61a, 62a with the n-type current diffusion region 33a (or an n−-type drift region 32) are formed at positions that are closer to the drain than is the position of the bottom of the trench 37a. A portion of the n−-type silicon carbide layer 71 is the n−-type drift region 32, the portion being other than the n-type current diffusion region 33a, the first and the second p+-type regions 61a, 62a, an n-type current diffusion region 33b described hereinafter, a first p+-type region 61b described hereinafter, a second p+-type region 62b and a third p+-type region 62c described hereinafter.

The first and the second p+-type regions 61a, 62a may be provided in the n−-type drift region 32 without providing the n-type current diffusion region 33a. Provided the pn junctions of the first and the second p+-type regions 61a, 62a with the n-type current diffusion region 33a (or the n−-type drift region 32) are positioned closer to the drain than is the bottom of the trench 37a, depth positions of the first and the second p+-type regions 61a, 62a may be variously changed according to design conditions.

In the p-type silicon carbide layer 72, the n+-type source region 35a and the p++-type contact region 36a are each selectively provided so as to be in contact with each other. The n+-type source region 35a is in contact with the gate insulating film 38a of the side wall of the trench 37a and opposes the gate electrode 39a across the gate insulating film 38a. In the region in which the main semiconductor element 11 is disposed, a portion of the p-type silicon carbide layer 72 constitutes the p-type base region 34a, the portion being other than the n+-type source region 35a and the p++-type contact region 36a.

An interlayer insulating film 40 is provided at the front surface of the semiconductor substrate 10 overall. All gate electrodes 39a of the main semiconductor element 11 are covered by the interlayer insulating film 40 and at a non-depicted part, are electrically connected to the gate pad 21b (refer to FIG. 1) via a gate runner (not depicted). In the region in which the main semiconductor element 11 is disposed, in the interlayer insulating film 40, a first contact hole 40a is provided that penetrates the interlayer insulating film 40 in the depth direction Z and reaches the front surface of the semiconductor substrate 10. The n+-type source region 35a and the p++-type contact region 36a are exposed by the first contact hole 40a.

In the first contact hole 40a, the front surface of the semiconductor substrate 10 is covered by a nickel silicide (NiSi) film 41a. The NiSi film 41a is provided only on a portion of the semiconductor substrate 10, the portion that is exposed by the first contact hole 40a. The NiSi film 41a forms an ohmic contact with the semiconductor substrate 10 (the n+-type source region 35a and the p++-type contact region 36a) in the first contact hole 40a. Instead of the NiSi film 41a, for example, a titanium silicide (TiSi) film forming an ohmic contact with the semiconductor substrate 10 may be provided.

Further, in the formation region of the main semiconductor element 11, a barrier metal 44a is provided spanning from on a surface of the interlayer insulating film 40 and across a surface of the NiSi film 41a. The barrier metal 44a, for example, has a stacked structure in which a titanium (Ti) film 42a and a titanium nitride (TiN) film 43a are sequentially stacked. The Ti film 42a, in the region in which the main semiconductor element 11 is disposed, covers surfaces of the interlayer insulating film 40 and the NiSi film 41a entirely. The TiN film 43a, for example, covers a surface of the Ti film 42a entirely. The barrier metal 44a has a function of preventing a mutual reaction between metal films constituting the barrier metal or between regions opposing each other across the barrier metal.

The source pad (source electrode) 21a is provided at a surface of the TiN film 43a entirely, so as to be embedded in the first contact hole 40a. The source pad 21a, in the first contact hole 40a, is electrically connected to the semiconductor substrate 10 (the $n^+$-type source region 35a and the $p^{++}$-type contact region 36a) via the barrier metal 44a. Further, the source pad 21a opposes the interlayer insulating film 40, across the barrier metal 44a. The source pad 21a and the barrier metal 44a are electrically insulated from the gate electrode 39a by the interlayer insulating film 40.

The source pad 21a is an aluminum (Al) alloy film that contains, as a main constituent, aluminum, which has excellent electrical conductivity and chemical stability. In particular, the source pad 21a, for example, may be an aluminum-silicon (Al—Si) film containing about 5% or less of silicon overall, may be an aluminum-silicon-copper (Al—Si—Cu) film containing about 5% or less of copper overall and about 5% or less of silicon overall, or may be an aluminum-copper (Al—Cu) film containing about 5% or less of copper overall. The source pad 21a may be an aluminum film having only aluminum as a constituent. The terminal pin 48a has a first end that is bonded on the source pad 21a via a plating film 47a and a solder layer (not depicted).

The terminal pin 48a has a second end that is bonded to a metal bar (not depicted) disposed opposing the front surface of the semiconductor substrate 10. Further, the second end of the terminal pin 48a is exposed outside a case (not depicted) in which the semiconductor chip (the semiconductor substrate 10) is mounted and is electrically connected to an external device (not depicted). In other words, the terminal pin 48a, for example, is an external connection terminal that leads electric potential of the source pad 21a outside. The terminal pin 48a is a wiring member being of a round-rod (cylindrical) shape that has a predetermined diameter, and is soldered to the plating film 47a, in an upright state substantially perpendicular to the front surface of the semiconductor substrate 10. The source pad 21a is grounded via the terminal pin 48a.

The plating film 47a, even under high-temperature conditions (for example, 200 degrees C. to 300 degrees C.), has high adhesiveness with the source pad 21a and is less likely to peel as compared to wire bonding. A portion of the surface of the source pad 21a, the portion being other than the plating film 47a, is covered by a first protective film 49a. In other words, the first protective film 49a is provided so as to cover the source pad 21a, and at a portion of the source pad 21a, the portion that is exposed by an opening of the first protective film 49a, the terminal pin 48a is bonded via the plating film 47a and the solder layer. A border of the plating film 47a and the first protective film 49a is covered by a second protective film 50a. The first and the second protective films 49a, 50a, for example, are polyimide films.

The drain electrode 51 forms an ohmic contact with the entire rear surface (a rear surface of the $n^+$-type starting substrate 31 that is an $n^+$-type drain region) of the semiconductor substrate 10. On the drain electrode 51, a non-depicted drain pad (electrode pad) is provided. The drain pad is soldered to the metal base plate (not depicted), and is in contact with at least a portion of a base part of a cooling fin (not depicted), via the metal base plate. A double-sided cooling structure is configured in which heat generated by the semiconductor substrate 10 is dissipated from a fin part of the cooling fin that is in contact with the rear surface of the semiconductor substrate 10 via the metal base plate, and is further dissipated from the metal bar to which the terminal pin 48a of the front surface of the semiconductor substrate 10 is bonded.

Further, in the active region 1, in a formation region of the current sensing part 12, a p-type base region 34b of the current sensing part 12 is selectively provided in a surface layer of the front surface of the semiconductor substrate 10. The p-type base region 34b of the current sensing part 12, the p-type base region 34a of the main semiconductor element 11, and the third $p^+$-type region 62c directly beneath the temperature sensing part 13 described hereinafter penetrate the p-type silicon carbide layer 72 in the depth direction Z and are separated from each other by an $n^-$-type region 32a that reaches the $n^-$-type silicon carbide layer 71.

The current sensing part 12 has a MOS gate constituted by the p-type base region 34b, an $n^+$-type source region 35b, a $p^{++}$-type contact region 36b, a trench 37b, a gate insulating film 38b, and a gate electrode 39b having a configuration similar to components corresponding to the main semiconductor element 11. Components of the MOS gate of the current sensing part 12 are provided in a formation region of the current sensing part 12 in the active region 1. The current sensing part 12, similarly to the main semiconductor element 11, may have the n-type current diffusion region 33b and the first and the second $p^+$-type regions 61b, 62b.

All gate electrodes 39b of the current sensing part 12 are covered by the interlayer insulating film 40 and at a non-depicted part, are electrically connected to the gate pad 21b (refer to FIG. 1) via a gate runner (not depicted). In the formation region of the current sensing part 12, in the interlayer insulating film 40, a second contact hole 40b is provided that penetrates the interlayer insulating film 40 in the depth direction Z and reaches the front surface of the semiconductor substrate 10. The $n^+$-type source region 35b and the $p^{++}$-type contact region 36b are exposed by the second contact hole 40b.

In the second contact hole 40b, the front surface of the semiconductor substrate 10 is covered by an NiSi film 41b. The NiSi film 41b is provided only on a portion of the semiconductor substrate 10, the portion that is exposed by the second contact hole 40b. The NiSi film 41b forms an ohmic contact with the semiconductor substrate 10 (the $n^+$-type source region 35b and the $p^{++}$-type contact region 36b) in the second contact hole 40b. Instead of the NiSi film 41b, for example, a TiSi film forming an ohmic contact with the semiconductor substrate 10 may be provided.

Further, in the formation region of the current sensing part 12, a barrier metal 44b is provided spanning from on the surface of the interlayer insulating film 40, across a surface of the NiSi film 41b. The barrier metal 44b, for example, has a stacked structure in which a Ti film 42b and a TiN film 43b are sequentially stacked. The Ti film 42b covers surfaces of the interlayer insulating film 40 and the NiSi film 41b entirely in the formation region of the current sensing part 12. The TiN film 43b, for example, covers a surface of the Ti film 42b entirely. The barrier metal 44b has a function of preventing mutual reaction between metal films constituting the barrier metal or between regions opposing each other across the barrier metal.

The OC pad (source electrode) 22 is provided at a surface of the TiN film 43b entirely, so as to be embedded in the second contact hole 40b. The OC pad 22, in the second contact hole 40b, is electrically connected with the semiconductor substrate 10 (the $n^+$-type source region 35b and the p++-type contact region 36b) via the barrier metal 44b. Further, the OC pad 22 opposes the interlayer insulating film 40, across the barrier metal 44b. The OC pad 22 and the barrier metal 44b are electrically insulated from the gate electrode 39b by the interlayer insulating film 40. A material of the OC pad 22 is similar to that of the source pad 21a.

On the OC pad 22, similarly to the terminal pin 48a on the source pad 21a, a terminal pin 48b has a first end that is bonded via a plating film 47b and solder layer (not depicted). The terminal pin 48b has a second end that, similarly to the terminal pin 48a on the source pad 21a, is exposed outside the case (not depicted) in which the semiconductor substrate 10 is mounted and is electrically connected to an external device (not depicted). In other words, the terminal pin 48b, for example, is an external connection terminal that leads electric potential of the OC pad 22 outside. The terminal pin 48b is a wiring member being of a round-rod (cylindrical) shape that has a diameter that is smaller than that of the terminal pin 48a. The OC pad 22 is grounded via the terminal pin 48b and an external resistor 15 (refer to FIG. 4).

A portion of the surface of the OC pad 22, the portion being other than the plating film 47b, similarly to the source pad 21a, is covered by a first protective film 49b. In other words, the first protective film 49b is provided so as to cover the OC pad 22, and at a portion of the OC pad 22, the portion that is exposed by an opening of the first protective film 49b, the terminal pin 48b is bonded via the plating film 47b and the solder layer. A border of the plating film 47b and the first protective film 49b is covered by a second protective film 50b. Materials of the plating film 47b and of the first and the second protective films 49b, 50b are respectively similar to those of the plating film 47a and the first and the second protective films 49a, 50a.

The temperature sensing part 13 is a poly-silicon diode formed by a pn junction of a p-type poly-silicon layer 81 that is a p-type anode region and an n-type poly-silicon layer 82 that is an n-type cathode region. The p-type poly-silicon layer 81 and the n-type poly-silicon layer 82 are formed on a field insulating film 80, in a formation region of the temperature sensing part 13. Directly beneath the p-type poly-silicon layer 81 and the n-type poly-silicon layer 82, in the surface layer of the front surface of the semiconductor substrate 10, the third p+-type region 62c is selectively provided. In the third p+-type region 62c, a p-type region 34c is selectively provided.

The third p+-type region 62c and the p-type region 34c oppose the p-type poly-silicon layer 81 and the n-type poly-silicon layer 82, across the field insulating film 80. An interlayer insulating film 83 is provided so as to cover the field insulating film 80, the p-type poly-silicon layer 81, and the n-type poly-silicon layer 82. In the interlayer insulating film 83, third and fourth contact holes 83a, 83b are provided that penetrate the interlayer insulating film 83 in the depth direction Z and reach the front surface of the semiconductor substrate 10. The anode pad 23a is exposed by the third contact hole 83a, and the cathode pad 23b is exposed by the fourth contact hole 83b.

The anode pad 23a is in direct contact with the p-type poly-silicon layer 81, in the third contact hole 83a. The cathode pad 23b is in direct contact with the n-type poly-silicon layer 82, in the fourth contact hole 83b. In other words, between the anode pad 23a and the p-type poly-silicon layer 81, and between the cathode pad 23b and the n-type poly-silicon layer 82, no barrier metal is provided. As a result, adhesiveness of the anode pad 23a and the p-type poly-silicon layer 81, and of the cathode pad 23b and the n-type poly-silicon layer 82 may be improved. A material of the anode pad 23a and the cathode pad 23b is similar to that of the source pad 21a.

Similarly to the source pad 21a of the main semiconductor element 11, the terminal pins 48c, 48d are respectively bonded to the anode pad 23a and the cathode pad 23b, via plating films 47c, 47d and the solder layer (not depicted). A portion of the surfaces of the anode pad 23a and the cathode pad 23b, the portion being other than the plating films 47c, 47d, is covered by a first protective film 49c, similarly to the source pad 21a. In other words, the first protective film 49c is provided so as to cover the anode pad 23a and the cathode pad 23b.

At a portion of the anode pad 23a, the portion that is exposed by an opening of the first protective film 49c, the terminal pin 48c is bonded via the plating film 47c and the solder layer. At a portion of the cathode pad 23b, the portion that is exposed by an opening of the first protective film 49c, the terminal pin 48d is bonded via the plating film 47d and the solder layer. The cathode pad 23b is grounded via the terminal pin 48d. A border of the plating film 47c and the first protective film 49c is covered by a second protective film 50c. Materials of the plating film 47c and the first and the second protective films 49c, 50c are respectively similar to those of the plating film 47a and the first and the second protective films 49a, 50a.

Figure 4:
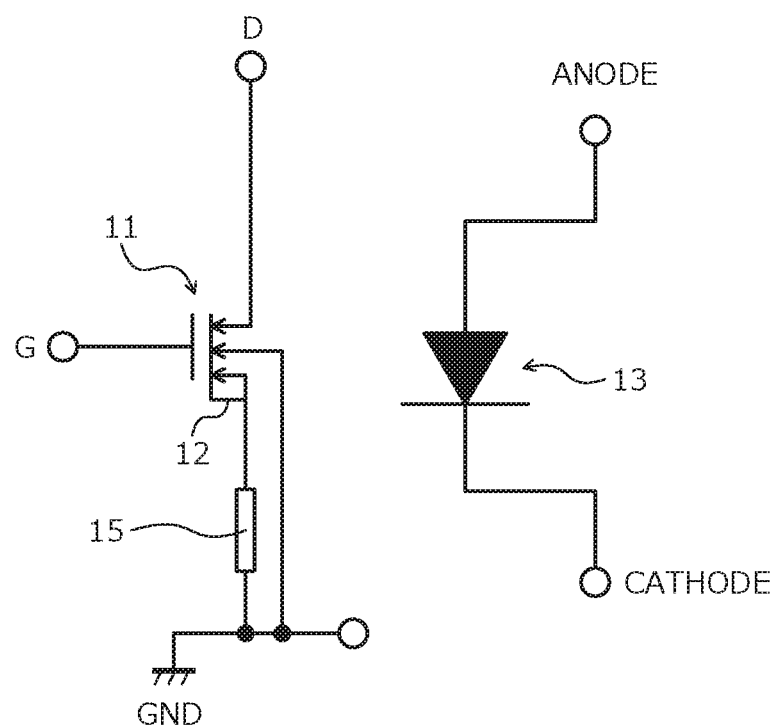
FIG. 4 is a circuit diagram depicting an equivalent circuit of the semiconductor device according to the first embodiment.

Operation of the semiconductor device according to the first embodiment will be described. FIG. 4 is a circuit diagram depicting an equivalent circuit of the semiconductor device according to the first embodiment. As depicted in FIG. 4, the current sensing part 12 is configured by some of the unit cells of the plural MOSFET unit cells constituting the main semiconductor element 11. A ratio (hereinafter, current sensing ratio) of sensing current flowing in the current sensing part 12 to main current flowing in the main semiconductor element 11 is preset. The current sensing ratio, for example, may be set by varying the number of unit cells by the main semiconductor element 11 and the current sensing part 12. According to the current sensing ratio, sensing current that is smaller than the main current flowing in the main semiconductor element 11 flows in the current sensing part 12. A source of the main semiconductor element 11 is connected to a grounding point GND. The resistor 15I, which is an external component, is connected between a source of the current sensing part 12 and the grounding point GND.

When the main current flows from the drain toward the source of the main semiconductor element 11, the sensing current of the current sensing part 12 flows from the drain toward the source of the current sensing part 12, through the resistor 15 and to the grounding point GND. Therefore, a voltage drop occurs at the resistor 15 due to the sensing current of the current sensing part 12. When overcurrent flows in the main semiconductor element 11, the sensing current of the current sensing part 12 also slightly increases according to the magnitude of overcurrent in the main semiconductor element 11. Therefore, the voltage drop at the resistor 15 also increases. Accordingly, by monitoring the size of the voltage drop at the resistor 15, overcurrent in the main semiconductor element 11 may be detected. When the voltage drop at the resistor 15 is a predetermined value or greater, gate voltage applied to the gate of the main semiconductor element 11 is gradually reduced and cut off by the calculation circuit part, thereby enabling destruction of the main semiconductor element 11 to be prevented.

The anode and cathode of the temperature sensing part 13 are electrically insulated from the main semiconductor element 11 and the current sensing part 12. Temperature dependency of voltage (forward voltage Vf) between the anode and cathode of the temperature sensing part 13 is obtained in advance and, for example, is stored in a non-depicted memory device. In the temperature sensing part 13, a constant voltage is usually applied to the voltage between the anode and cathode. Changes in the value of the voltage (forward voltage Vf) between the anode and cathode of the temperature sensing part 13 are monitored. Based on the changes in the value of the voltage between the anode and the cathode of the temperature sensing part 13 and the temperature dependency, temperature increases of the semiconductor device may be detected. Therefore, when the change in the value of the voltage between the anode and cathode in the temperature sensing part 13 becomes a predetermined value or higher, the gate voltage applied to the gate of the main semiconductor element 11 is gradually reduced and cut off by the calculation circuit part, thereby enabling destruction of the main semiconductor element 11 to be prevented.

A method of manufacturing the semiconductor device according to an embodiment will be described. FIGS. 5, 6, 7, 8, 9, and 10 are cross-sectional views of the semiconductor device according to the first embodiment during manufacture. In FIGS. 5 to 10, of all the elements fabricated (manufactured) on the single semiconductor substrate 10, only the main semiconductor element 11 is depicted. Herein, formation of parts of the main semiconductor element 11 will be described with reference to FIGS. 1 to 3, and 5 to 10, while parts of the current sensing part 12 and the temperature sensing part 13 will be described with reference to FIGS. 1 to 3.

Figure 5:
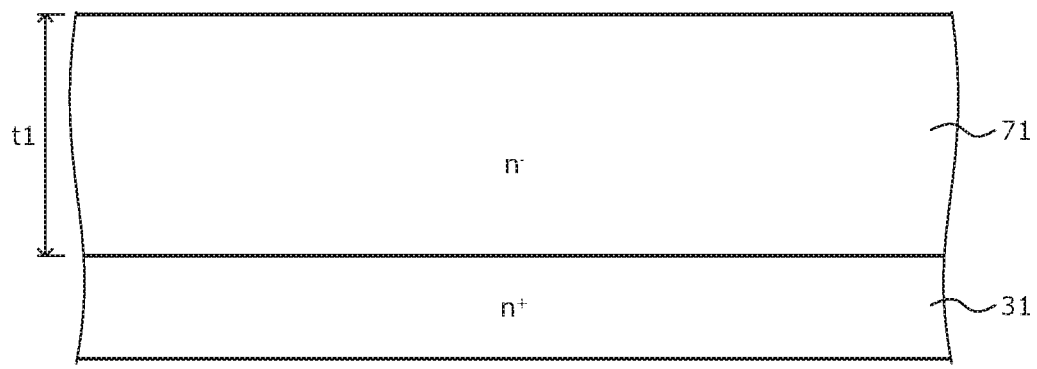
FIG. 5 is a cross-sectional view of the semiconductor device according to the first embodiment.

First, as depicted in FIG. 5, the n$^+$-type starting substrate (semiconductor wafer) 31 containing silicon carbide is prepared. The n$^+$-type starting substrate 31, for example, may be a silicon carbide single crystal substrate doped with nitrogen (N). A front surface of the n$^+$-type starting substrate 31, for example, may be a (0001) plane, a so-called Si-face. Next, on the front surface of the n$^+$-type starting substrate 31, the n$^-$-type silicon carbide layer 71 doped with nitrogen at a lower concentration than the n$^+$-type starting substrate 31 is formed by epitaxial growth. A thickness t1 of the n$^-$-type silicon carbide layer 71 corresponds to a thickness of the n$^-$-type drift region 32 and, for example, may be about 30 μm when the breakdown voltage is 3300V.

Figure 6:
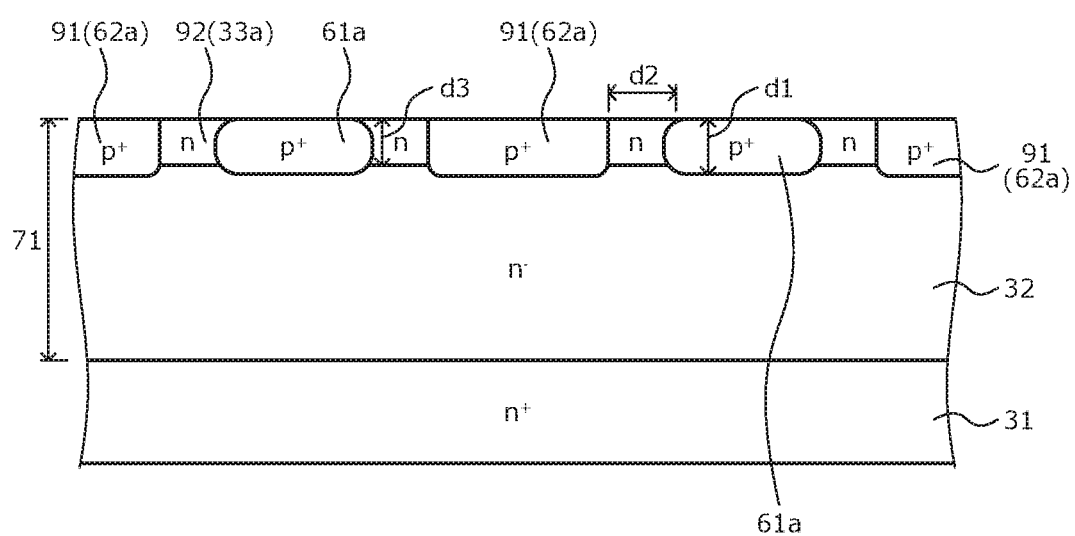
FIG. 6 is a cross-sectional view of the semiconductor device according to the first embodiment during manufacture.

Next, as depicted in FIG. 6, by photolithography and ion implantation of a p-type impurity such as, for example, aluminum, in the formation region of the main semiconductor element 11, in a surface layer of the n$^-$-type silicon carbide layer 71, the first p$^+$-type region 61a and a p$^+$-type region (hereinafter, p$^+$-type partial region) 91 are each selectively formed. The p$^+$-type partial region 91 is a portion of the second p$^+$-type region 62a. The first p$^+$-type region 61a and the p$^+$-type partial region 91 are disposed to alternate each other repeatedly along a direction (for example, the first direction X or the second direction Y in FIGS. 1 and 2) parallel to the front surface of the n$^+$-type starting substrate 31.

The first p$^+$-type region 61a and the p$^+$-type partial region 91, for example, are disposed in a striped shape extending along the second direction Y or the first direction X indicated in FIGS. 1 and 2. A distance d2 between the first p$^+$-type region 61a and the adjacent p$^+$-type partial region 91, for example, may be about 1.5 μm. A depth d1 and impurity concentration of the first p$^+$-type region 61a and the p$^+$-type partial region 91, for example, may be about 0.5 μm and about 5.0×10$^{18}$/cm$^3$, respectively. Further, an ion implantation mask used in forming the first p$^+$-type region 61a and the p$^+$-type partial region 91 is removed.

Next, by photolithography and ion implantation of an n-type impurity such as, for example, nitrogen, an n-type region (hereinafter, n-type partial region) 92 is formed in the surface layer of the n$^-$-type silicon carbide layer 71. An impurity concentration of the n-type partial region 92, for example, may be about 1.0×10$^{17}$/cm$^3$. The n-type partial region 92 is a portion of the n-type current diffusion region 33a. Here, a depth d3 of the n-type partial region 92 may be variously changed with respect to the depth d1 of the first p$^+$-type region 61a and the p$^+$-type partial region 91, thereby determining a depth of the first and the second p$^+$-type regions 61a, 62a with respect to the n-type current diffusion region 33a.

For example, when the depth of the first and the second p$^+$-type regions 61a, 62a terminates at a position deeper than the n-type current diffusion region 33a, the depth d3 of the n-type partial region 92 may be about 0.4 μm, which is shallower than the depth of the first p$^+$-type region 61a and the p$^+$-type partial region 91. Of the n$^-$-type silicon carbide layer 71, a portion that is closer to the drain than is the n-type partial region 92 is the n$^-$-type drift region 32. Further, an ion implantation mask used in forming the n-type partial region 92 is removed. A sequence in which the n-type partial region 92, the first p$^+$-type region 61a, and the p$^+$-type partial region 91 are formed may be interchanged.

Figure 7:
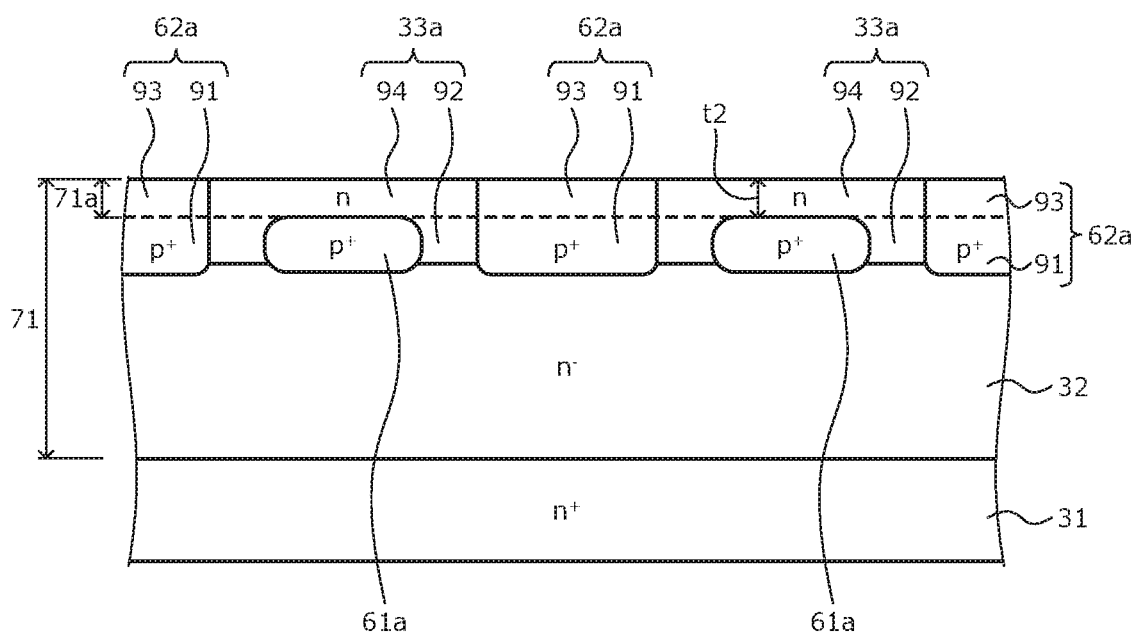
FIG. 7 is a cross-sectional view of the semiconductor device according to the first embodiment during manufacture.

Next, as depicted in FIG. 7, further on the n$^-$-type silicon carbide layer 71, an n$^-$-type silicon carbide layer doped with an n-type impurity such as, for example, nitrogen has a thickness t2 of, for example, 0.5 μm and is formed by epitaxial growth, and increases the thickness of the n$^-$-type silicon carbide layer 71. An impurity concentration of the n$^-$-type silicon carbide layer 71 from a portion (the surface layer of the n$^-$-type silicon carbide layer 71) 71a that increases the thickness, to a border with the n$^+$-type starting substrate 31 may be, for example, about 3.0×10$^{15}$/cm$^3$ and uniform in the depth direction.

Next, by photolithography and ion implantation of a p-type impurity such as aluminum, a p$^+$-type partial region 93 is selectively formed in a part of the portion 71a that increases the thickness of the n$^-$-type silicon carbide layer 71, the part that opposes the p$^+$-type partial region 91 in the depth direction. The p$^+$-type partial region 93 is formed to a depth reaching the p$^+$-type partial region 91. The p$^+$-type partial regions 91, 93 are connected to each other in the depth direction and thereby form the second p$^+$-type region 62a. A width and an impurity concentration of the p$^+$-type partial region 93, for example, are substantially equal to those of the p$^+$-type partial region 91. Further, an ion implantation mask used in forming the p$^+$-type partial region 93 is removed.

Next, by photolithography and ion implantation of an n-type impurity such as, for example, nitrogen, for example, across the active region overall, an n-type partial region 94 is formed in the portion 71a that increases the thickness of the n$^-$-type silicon carbide layer 71, the being formed to a depth reaching the n-type partial region 92. An impurity concentration of the n-type partial region 94 is substantially equal to that of the n-type partial region 92. The n-type partial regions 92, 94 are connected to each other in the depth direction and thereby form the n-type current diffusion region 33a. A sequence in which the p$^+$-type partial region 93 and the n-type partial region 94 are formed may be interchanged. Further, an ion implantation mask used in forming the n-type partial region 94 is removed.

Figure 8:
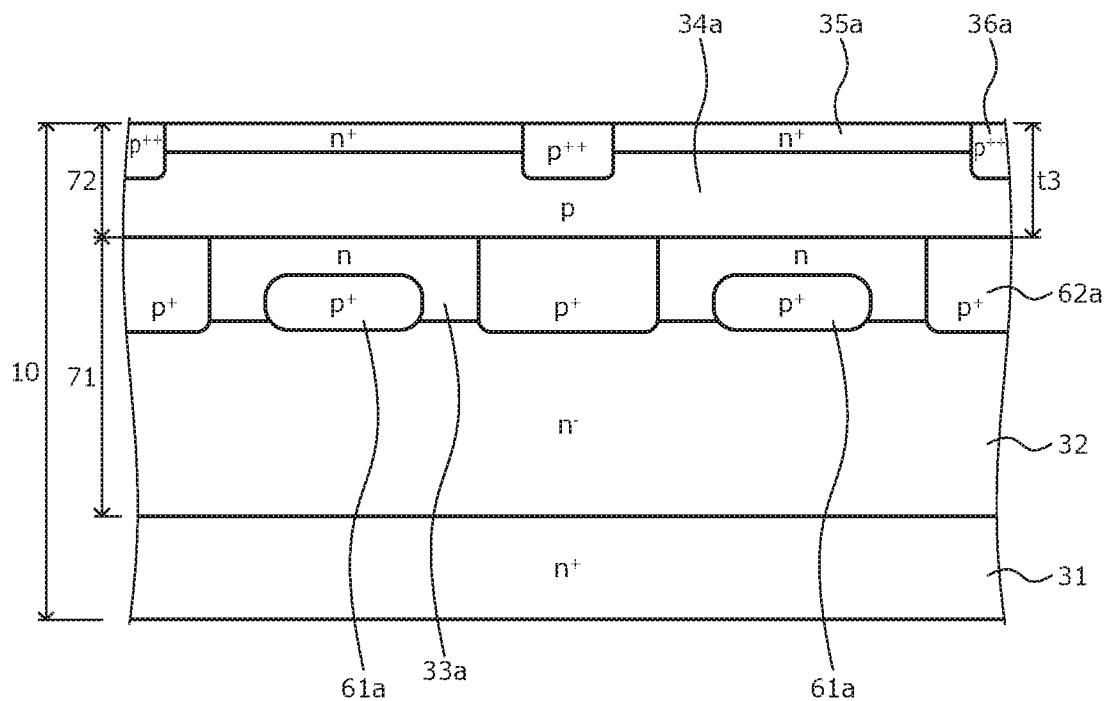
FIG. 8 is a cross-sectional view of the semiconductor device according to the first embodiment during manufacture.

Next, as depicted in FIG. 8, on the n⁻-type silicon carbide layer 71, the p-type silicon carbide layer 72 doped with a p-type impurity such as, for example, aluminum is formed by epitaxial growth. A thickness t3 and an impurity concentration of the p-type silicon carbide layer 72, for example, may be about 1.3 μm and about $4.0\times10^{17}/cm^3$, respectively. As a result, the semiconductor substrate (semiconductor wafer) 10 is formed in which the n⁻-type silicon carbide layer 71 and the p-type silicon carbide layer 72 are sequentially deposited on the n⁺-type starting substrate 31.

Next, by photolithography and ion implantation of an n-type impurity such as, for example, phosphorus (P), the n⁺-type source region 35a is selectively formed in a surface layer of the p-type silicon carbide layer 72. Further, an ion implantation mask used in forming the n⁺-type source region 35a is removed. Next, by photolithography and ion implantation of a p-type impurity such as aluminum, the p⁺⁺-type contact region 36a is selectively formed in the surface layer of the p-type silicon carbide layer 72. Further, an ion implantation mask used in forming the p⁺⁺-type contact region 36a is removed.

Next, by photolithography and ion implantation of an n-type impurity such as, for example, phosphorus, the n⁺-type region 32a is formed that penetrates the p-type silicon carbide layer 72 in the depth direction Z and reaches the n⁻-type silicon carbide layer 71. Further, an ion implantation mask used in forming the n⁻-type region 32a is removed. A sequence in which the n⁺-type source region 35a, the p⁺⁺-type contact region 36a, and the n⁻-type region 32a are formed may be interchanged. In the formation region of the main semiconductor element 11, a portion of the p-type silicon carbide layer 72 constitutes the p-type base region 34a, the portion being other than the n⁺-type source region 35a, the p⁺⁺-type contact region 36a, and the n⁻-type region 32a.

In the ion implantations described above, for example, a resist film or an oxide film may be used as the ion implantation mask. Next, with respect to all diffusion regions (the first and the second p⁺-type regions 61a, 62a, the n-type current diffusion region 33a, the n⁺-type source region 35a, the p⁺⁺-type contact region 36a, and the n⁻-type region 32a) formed by ion implantation, heat treatment (activation annealing) for activating impurities is performed, for example, at about 1700 degrees C. for about 2 minutes. The activation annealing may be performed once, collectively, after all of the diffusion regions are formed, or may be performed with each formation of a diffusion region by ion implantation.

Figure 9:
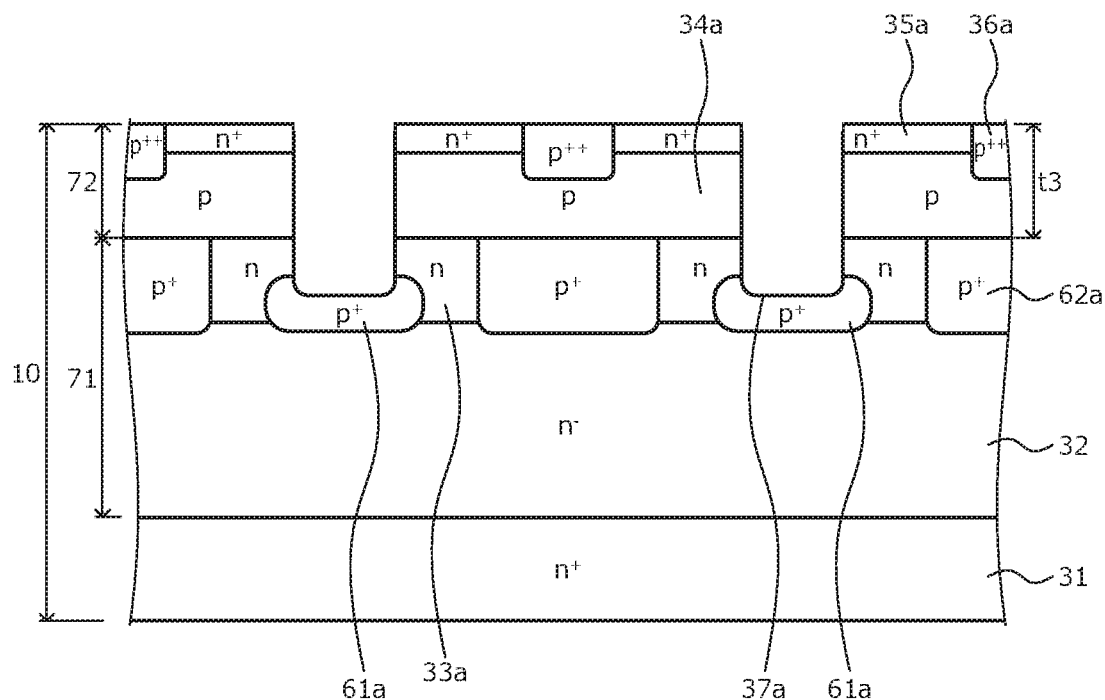
FIG. 9 is a cross-sectional view of the semiconductor device according to the first embodiment during manufacture.

Next, as depicted in FIG. 9, by photolithography and, for example, dry etching, the trench 37a is formed that penetrates the n⁺-type source region 35a and the p-type base region 34a, and reaches the first p⁺-type region 61a in the n-type current diffusion region 33a. An etching mask used in forming the trench 37a, for example, may be a resist film or an oxide film.

Figure 10:
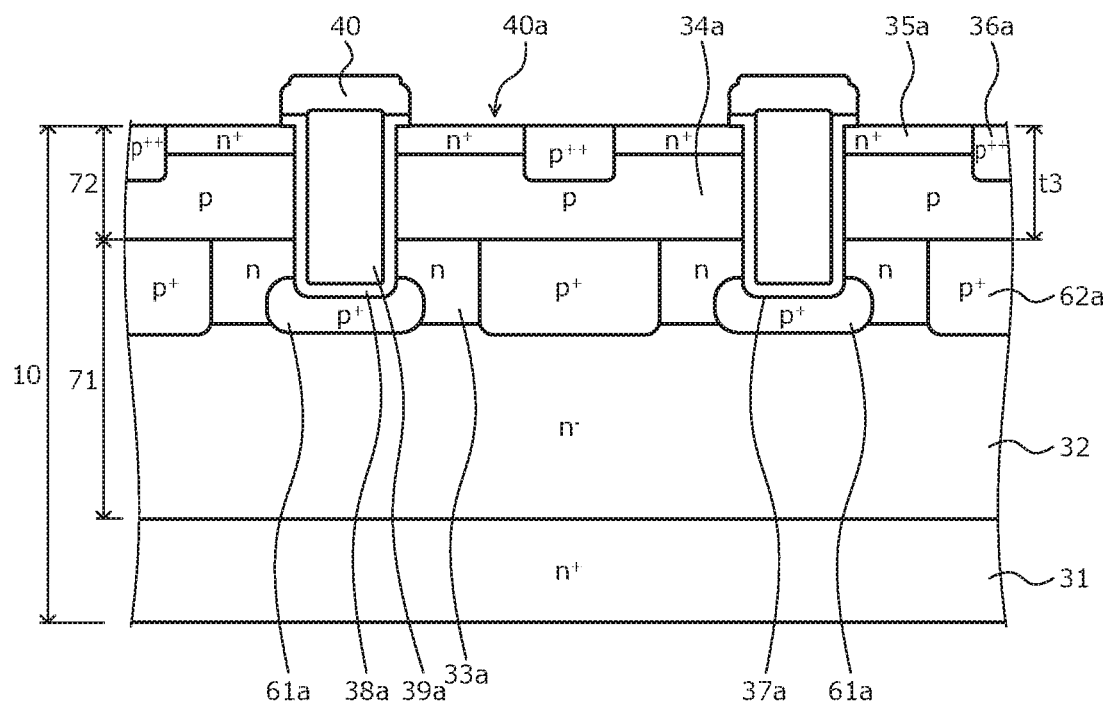
FIG. 10 is a cross-sectional view of the semiconductor device according to the first embodiment during manufacture.

Next, as depicted in FIG. 10, along the surface of the semiconductor substrate 10 and the inner wall of the trench 37a, an oxide film constituting the gate insulating film 38a is formed. The gate insulating film 38a, for example, may be formed by thermally oxidizing the surface of the semiconductor substrate 10 and the inner wall of the trench 37a by heat treatment at a temperature of about 1000 degrees C. in an oxygen (O₂) atmosphere. Further, the gate insulating film 38a may be a film deposited by a high temperature oxide (HTO) chemical reaction.

Next, a poly-silicon (poly-Si) layer doped with, for example, phosphorus is deposited on the gate insulating film 38a so as to be embedded in the trench 37a. Further, the poly-silicon layer is patterned, leaving in each of the trenches 37a, a portion constituting the gate electrode 39a. Here, the poly-silicon layer may be left so as to protrude outwardly from the front surface of the semiconductor substrate 10, or the poly-silicon layer may be etched so as to be inside, lower than the front surface of the semiconductor substrate 10.

Further, diffusion regions of all elements (for example, the current sensing part 12, for example, a diffusion diode constituting the over-voltage protecting part 14, a complementary MOS (CMOS) configuring the calculation circuit part) disposed in the semiconductor substrate 10, other than the main semiconductor element 11 described above, suffice to be respectively formed in regions separated by the n⁻-type region 32a. Further, the elements disposed in the semiconductor substrate 10 suffice to be formed concurrently with diffusion regions of the main semiconductor element 11 having the same conductivity-type impurity concentration and diffusion depth. Further, gate trenches, gate insulating films and gate electrodes of all elements disposed in the semiconductor substrate 10 suffice to be respectively formed concurrently with the trench 37a, the gate insulating film 38a, and the gate electrode 39a of the main semiconductor element 11.

For example, the n-type current diffusion region 33b, the p-type base region 34b, the n⁺-type source region 35b, the p⁺⁺-type contact region 36b, and the first and the second p⁺-type regions 61b, 62b of the current sensing part 12 suffice to be respectively formed concurrently with the n-type current diffusion region 33a, the p-type base region 34a, the n⁺-type source region 35a, the p⁺⁺-type contact region 36a, and the first and the second p⁺-type regions 61a, 62a of the main semiconductor element 11. The trench 37b, the gate insulating film 38b, and the gate electrode 39b of the current sensing part 12 are respectively formed concurrently with the trench 37a, the gate insulating film 38a, and the gate electrode 39a of the main semiconductor element 11.

A portion of third p⁺-type region 62c, which is formed directly beneath the temperature sensing part 13, suffices to be formed concurrently with the second p⁺-type region 62a (the p⁺-type partial regions 91, 93) of the main semiconductor element 11. Further, in portions of the p-type silicon carbide layer 72, the portions that oppose, in the depth direction, the p⁺-type partial regions 91, 93 that constitute a portion of the third p⁺-type region 62c, a p⁺-type partial region suffices to be formed to a depth reaching the p⁺-type partial region 93 and so that a portion of the p-type silicon carbide layer 72, the portion that constitutes the p-type region 34c, remains inside. As a result, the third p⁺-type region 62c that has the p-type region 34c therein is formed directly beneath the temperature sensing part 13.

Next, in the formation region of the temperature sensing part 13, the field insulating film 80 is formed on the front surface of the semiconductor substrate 10. Next, on the field insulating film 80, a poly-silicon layer that is doped with, for example, phosphorous and constitutes the n-type poly-silicon layer 82 is deposited. Next, by photolithography and ion implantation of a p-type impurity, a portion of the poly-silicon layer is inverted to a p-type region. The portion of poly-silicon layer inverted to a p-type region constitutes the p-type poly-silicon layer 81. Next, the poly-silicon layer is patterned, leaving portions constituting the p-type poly-silicon layer 81 and the n-type poly-silicon layer 82. The p-type poly-silicon layer 81 and the n-type poly-silicon layer 82 are formed by a process different from that of the gate electrodes 39a, 39b of the current sensing part 12 and the main semiconductor element 11.

Next, at the front surface of the semiconductor substrate 10 entirely, the interlayer insulating films 40, 83 that, for example, have a thickness of about 1 μm are formed so as to cover the gate electrodes 39a, 39b and the p-type poly-silicon layer 81 and the n-type poly-silicon layer 82. The interlayer insulating films 40, 83, for example, may be a phosphosilicate glass (PSG). Next, by photolithography and etching, the interlayer insulating film 40 and the gate insulating films 38a, 38b are selectively removed, forming the first and the second contact holes 40a, 40b in the interlayer insulating film 40, and exposing the n$^+$-type source regions 35a, 35b and the p$^{++}$-type contact regions 36a, 36b. Next, by heat treatment, the interlayer insulating films 40, 83 are planarized (reflow).

Next, for example, by sputtering, a nickel (Ni) film is formed from surfaces of the interlayer insulating films 40, 83, across a surface of a portion of the semiconductor substrate 10, the portion that is exposed by the first and the second contact holes 40a, 40b. For example, the nickel (Ni) film is left only on portions of the semiconductor substrate 10 exposed by the first and the second contact holes 40a, 40b. Further, by heat treatment, the left portions of the nickel (Ni) film are converted to a silicide, and in the first and the second contact holes 40a, 40b, form the NiSi films 41a, 41b that form an ohmic contact with the front surface of the semiconductor substrate 10. Further, for example, a Ni film formed by sputtering at the rear surface of the semiconductor substrate 10 entirely is converted into a silicide, whereby a NiSi film that constitutes the drain electrode 51 that forms an ohmic contact with the rear surface of the semiconductor substrate 10 is formed.

Next, for example, by sputtering, the barrier metals 44a, 44b are formed by sequentially forming the Ti films 42a, 42b and the TiN films 43a, 43b along the front surface of the semiconductor substrate 10, spanning surfaces of the interlayer insulating films 40, 83 and surfaces of the NiSi films 41a, 41b. The p-type poly-silicon layer 81 and the n-type poly-silicon layer 82 are covered by the interlayer insulating film 83 at the time of formation of the NiSi films 41a, 41b and the barrier metals 44a, 44b. Therefore, the barrier metals 44a, 44b and an Ni film constituting a material of the NiSi films 41a, 41b are not formed at surfaces of the p-type poly-silicon layer 81 and the n-type poly-silicon layer 82.

Next, the barrier metals 44a, 44b are patterned and left in the formation region of the main semiconductor element 11 and the formation region of the current sensing part 12. The barrier metals 44a, 44b may be formed so as to not directly contact the p-type poly-silicon layer 81 and the n-type poly-silicon layer 82, and in the formation region of the temperature sensing part 13, may extend onto the interlayer insulating film 83. Next, by photolithography and etching, the interlayer insulating film 83 is selectively removed, forming the third and the fourth contact holes 83a, 83b, and exposing the p-type poly-silicon layer 81 and the n-type poly-silicon layer 82 by the third and the fourth contact holes 83a, 83b. Next, by heat treatment, the interlayer insulating film 83 is planarized.

Next, for example, by sputtering, Al alloy film constituting an electrode pad is formed on the surfaces of the interlayer insulating films 40, 83 so as to be embedded in the first to the fourth contact holes 40a, 40b, 83a, 83b. A thickness of the Al alloy film, for example, may be about 5 μm. Instead of the Al alloy film, an Al film may be formed. Next, by photolithography and etching, the Al alloy film is patterned, leaving portions of the Al alloy film embedded in the first to the fourth contact holes 40a, 40b, 83a, 83b as the source pad 21a, the OC pad 22, the anode pad 23a, and the cathode pad 23b, respectively.

As a result, the source pad 21a is electrically connected to the n$^+$-type source region 35a and the p$^{++}$-type contact region 36a, via the NiSi film 41a and the barrier metal 44a. The OC pad 22 is electrically connected to the n$^+$-type source region 35b and the p$^{++}$-type contact region 36b, via the NiSi film 41b and the barrier metal 44b. The anode pad 23a and the cathode pad 23b are directly connected electrically to the p-type poly-silicon layer 81 and the n-type poly-silicon layer 82, respectively. Together with the source pad 21a and the OC pad 22, the gate pad 21b and the OV pad 24 of the over-voltage protecting part 14 may be formed by a same stacked layer structure as that of the source pad 21a and the OC pad 22.

Next, for example, by sputtering, at a surface of the drain electrode 51, for example, a Ti film, an Ni film, and a gold (Au) films are sequentially stacked, forming the drain pad (not depicted). Next, a polyimide film is formed so as to cover the electrode pads (the source pad 21a, the gate pad 21b, the OC pad 22, the anode pad 23a, the cathode pad 23b, and the OV pad 24). Next, by photolithography and etching, the polyimide film is selectively removed, thereby forming the first protective films 49a to 49c that respectively cover the electrode pads and opening the first protective films 49a to 49c. In FIG. 3, the gate pad 21b; the OV pad 24; first and second protective films, plating films, and terminal pins of the gate pad 21b and of the OV pad 24 are not depicted.

Next, by general plating preprocessing, portions of the electrode pads 21a, 21b, 22, 23a, 23b, 24 exposed by the openings of the first protective films 49a to 49c are put in a clean state suitable for plating. Next, by a plating process, the plating films 47a to 47c are formed at the portions of the electrode pads 21a, 21b, 22, 23a, 23b, 24 exposed by the openings of the first protective films 49a to 49c. Here, the first protective films 49a to 49c function as masks that suppress wetting and spreading of the plating films 47a to 47c. Thicknesses of the plating films 47a to 47c, for example, may be about 5 μm.

Next, the second protective films 50a to 50c that cover borders of the plating films 47a to 47c and the first protective films 49a to 49c are formed. Next, the terminal pins 48a to 48c are bond on the plating films 47a to 47c, respectively by solder layers (not depicted). Here, the second protective films 50a to 50c function as masks that suppress wetting and spreading of the solder layers. Thereafter, the semiconductor substrate 10 (semiconductor wafer) is diced (cut) into individual chips, thereby completing the semiconductor device depicted in FIGS. 1 and 2.

As described above, according to the first embodiment, electrode pads (anode pad and cathode pad) that contain aluminum and a poly-silicon layer (p-type poly-silicon layer and n-type poly-silicon layer) that constitute the temperature sensing part are in direct contact with each other, not through a barrier metal. As a result, even when the main semiconductor element that has silicon carbide as a semiconductor material generates heat around 200 degrees C. to 250 degrees C., adhesiveness of the electrode pads and the poly-silicon layer that constitutes the temperature sensing part may be improved. Accordingly, in the temperature sensing part, an occurrence of contact failure may be suppressed. Further, according to the first embodiment, the p-type impurity amount of the p-type poly-silicon layer is increased, improving the ohmic property of the p-type poly-silicon layer and the anode pad and enabling contact resistance of the p-type poly-silicon layer and the anode pad to be lowered.

Figure 11:
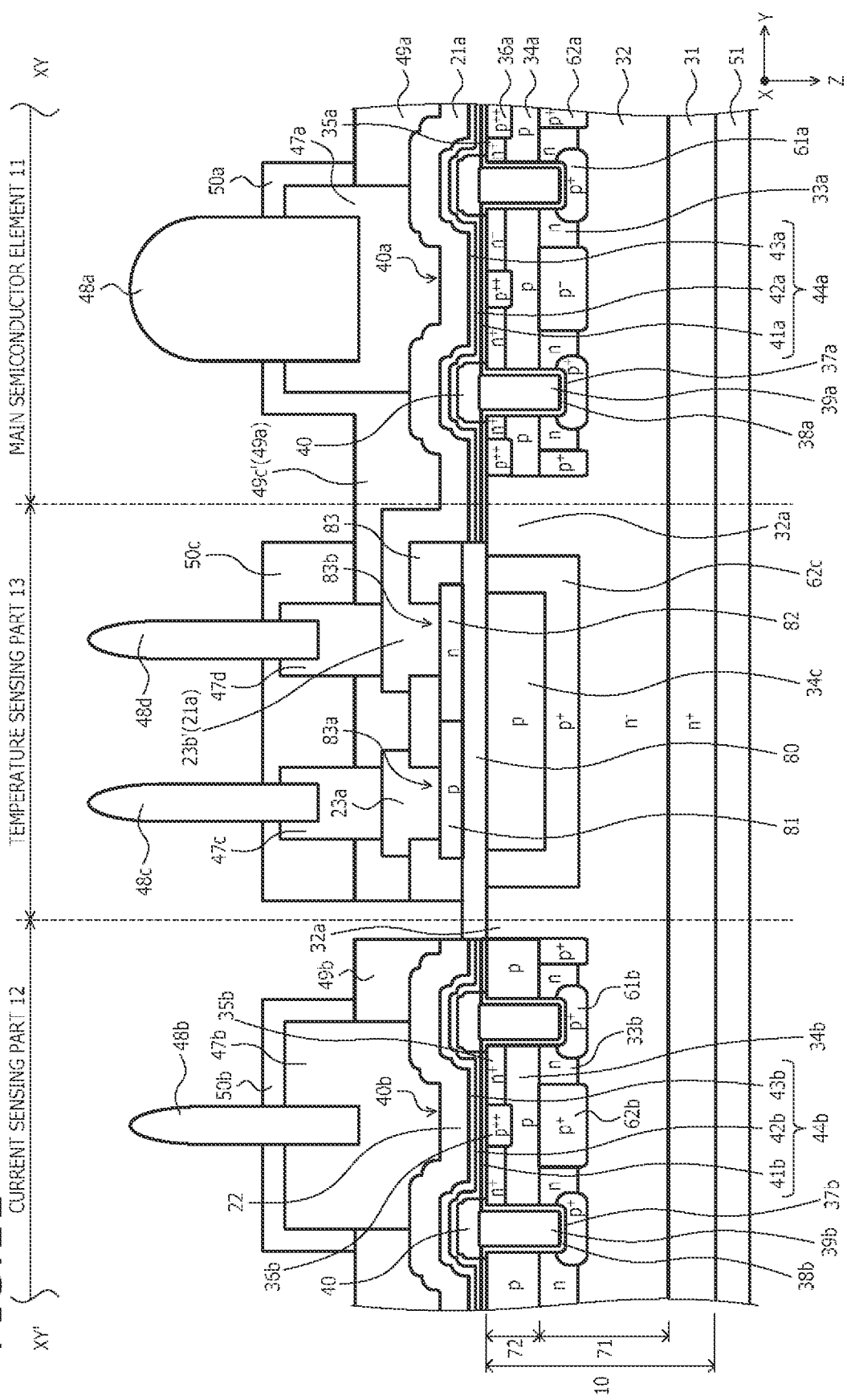
FIG. 11 is a cross-sectional view of the semiconductor device according to a second embodiment.
Figure 12:
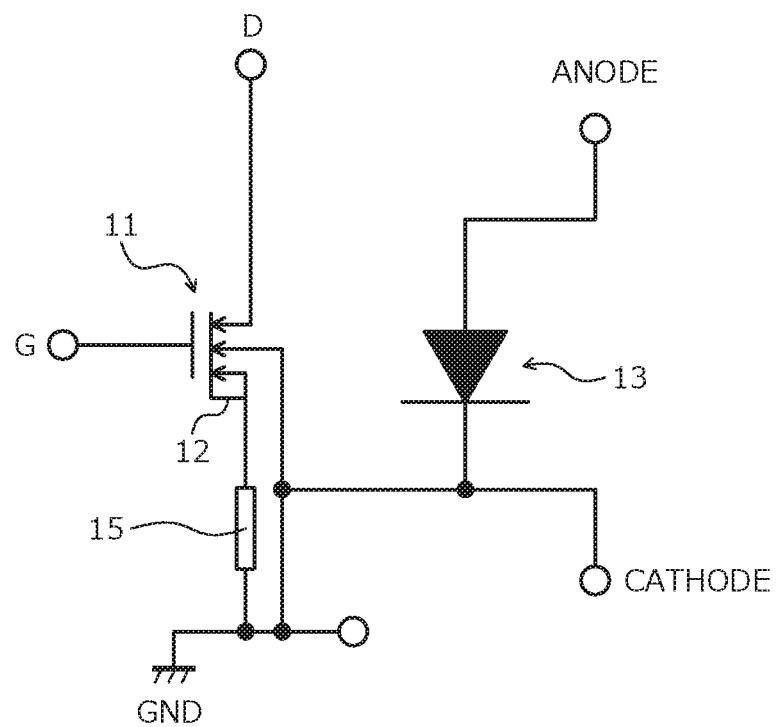
FIG. 12 is a circuit diagram depicting an equivalent circuit of the semiconductor device according to the second embodiment.

A structure of the semiconductor device according to a second embodiment will be described. FIG. 11 is a cross-sectional view of the semiconductor device according to the second embodiment. FIG. 12 is a circuit diagram depicting an equivalent circuit of the semiconductor device according to the second embodiment. The semiconductor device according to the second embodiment differs from the semiconductor device according to the first embodiment in that the source pad 21a of the main semiconductor element 11 and a cathode pad 23b' of the temperature sensing part 13 are in direct contact with each other. In other words, the cathode of the temperature sensing part 13 is connected between the grounding point GND and the source of the main semiconductor element 11 (refer to FIG. 12).

In particular, as depicted in FIG. 11, the source pad 21a of the main semiconductor element 11 extends from the region in which the main semiconductor element 11 is disposed, to a region in which the temperature sensing part 13 is disposed, is embedded in the fourth contact hole 83b, and is directly in contact with the n-type poly-silicon layer 82. In other words, the source pad 21a of the main semiconductor element 11 serves as the cathode pad 23b' of the temperature sensing part 13. The first protective film 49a that covers the source pad 21a extends from the region in which the main semiconductor element 11 is disposed, to the region in which the temperature sensing part 13 is disposed, and covers a portion of the source pad 21a, the portion that serves as the cathode pad 23b'.

As described above, according to the second embodiment, only a source pad constituted by an Al alloy film or an Al film of the main semiconductor element is in direct contact with the n-type poly-silicon layer of the temperature sensing part and serves as the cathode pad. Therefore, adhesiveness of the n-type poly-silicon layer of the temperature sensing part and the portion of the source pad serving as the cathode pad may be improved. Accordingly, even when the semiconductor substrate generates a high temperature, adhesiveness of the cathode pad and the n-type poly-silicon layer of the temperature sensing part is ensured, thereby enabling effects similar to those of the first embodiment to be obtained.

Further, according to the second embodiment, the source pad of the main semiconductor element and the cathode pad of the temperature sensing part are connected to each other, thereby enabling stabilization of grounding-point electric potential, which is cathode electric potential of the temperature sensing part. As a result, by disposing the temperature sensing part, for example, in a center portion of the semiconductor substrate, even with a layout in which a wiring layer for electrically connecting the p-type poly-silicon layer and the n-type poly-silicon layer of the temperature sensing part to the anode pad and the cathode pad, respectively, is routed over a long distance on the front surface of the semiconductor substrate, operation of the temperature sensing part may be stabilized.

Figure 13:
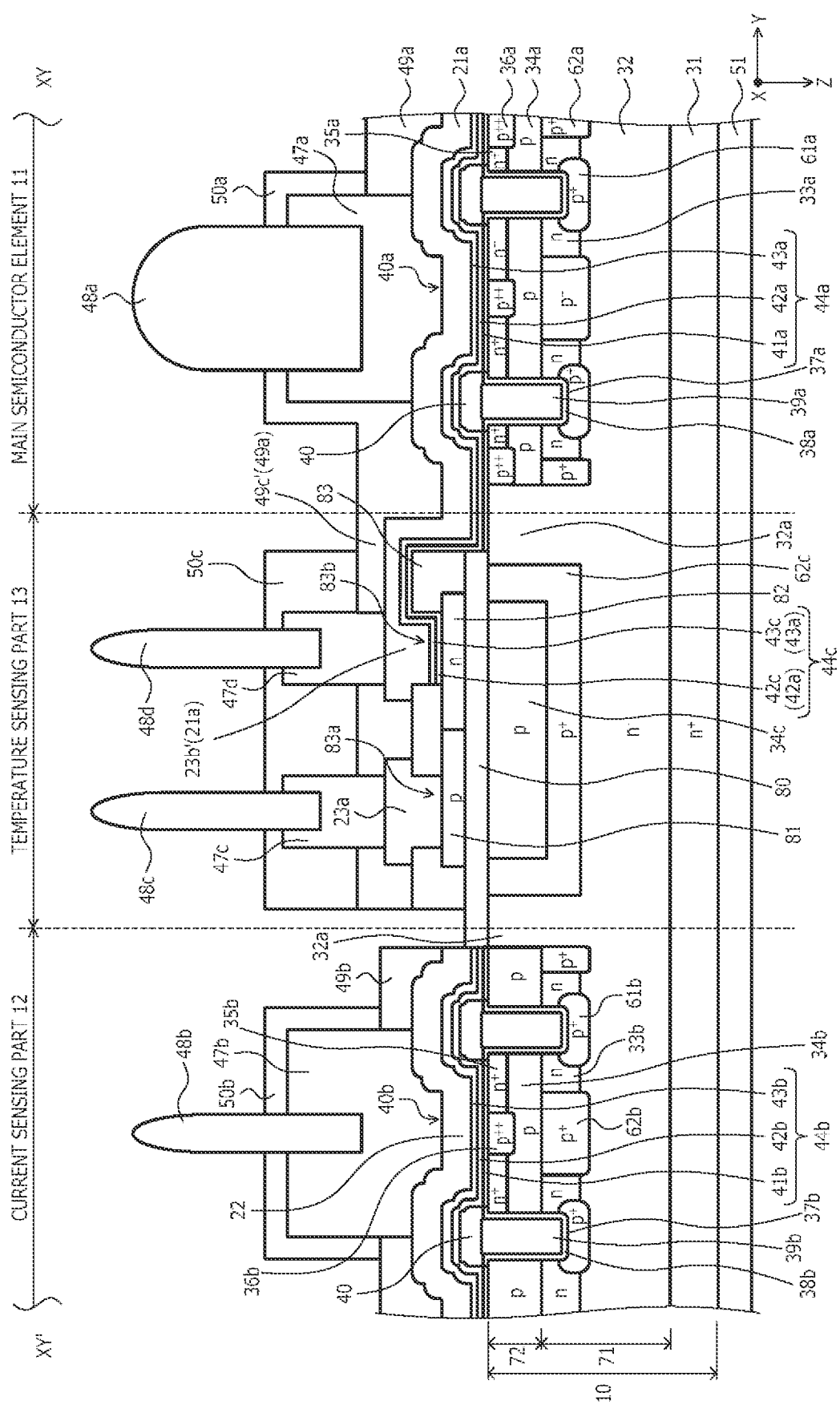
FIG. 13 is a cross-sectional view of a structure of the semiconductor device according to a third embodiment.
Figure 14:
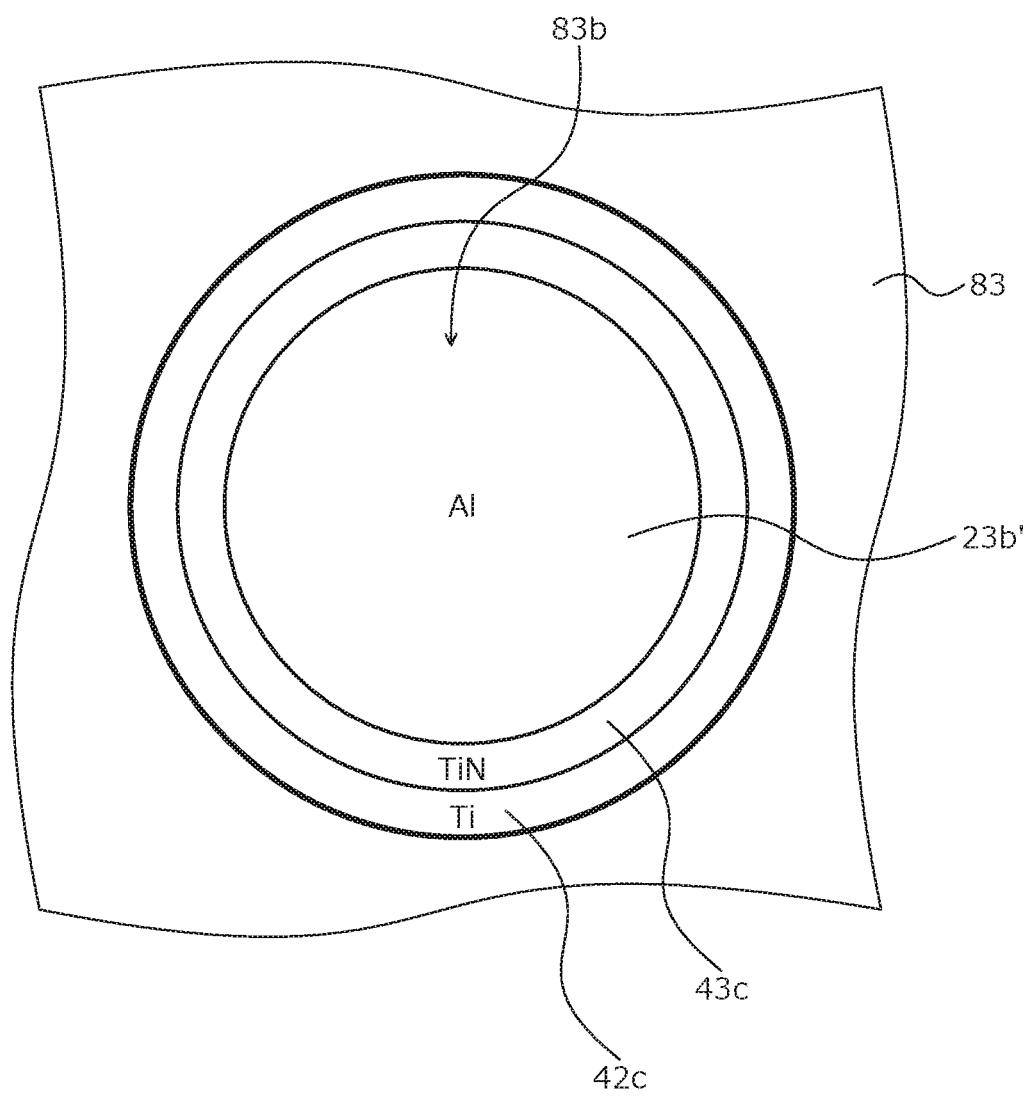
FIG. 14 is a plan view depicting an enlarged view of a portion of FIG. 13.

A structure of the semiconductor device according to a third embodiment will be described. FIG. 13 is a cross-sectional view of the structure of the semiconductor device according to the third embodiment. FIG. 14 is a plan view depicting an enlarged view of a portion of FIG. 13. FIG. 14 depicts an enlarged view of the fourth contact hole 83b depicted in FIG. 13. The semiconductor device according to the third embodiment differs from the semiconductor device according to the second embodiment in that a barrier metal 44c is provided between the cathode pad 23b' and the n-type poly-silicon layer 82 of the temperature sensing part 13. Without providing a barrier metal between the anode pad 23a and the p-type poly-silicon layer 81 of the temperature sensing part 13, the p-type poly-silicon layer 81 and the anode pad 23a are in direct contact similarly as in the first embodiment.

In particular, as depicted in FIG. 13, the barrier metal 44a of the main semiconductor element 11 extends from the region in which the main semiconductor element 11 is disposed, to the region in which the temperature sensing part 13 is disposed, and in the fourth contact hole 83b, is in contact with the n-type poly-silicon layer 82 of the temperature sensing part 13. In other words, in the fourth contact hole 83b, the barrier metal 44c is formed on the n-type poly-silicon layer 82 and is constituted by a Ti film 42c and a TiN film 43c that are sequentially formed. Through the barrier metal 44c, the n-type poly-silicon layer 82 and the cathode pad 23b' are electrically connected to each other. Electrical connection of the n-type poly-silicon layer 82 and the cathode pad 23b' through the barrier metal 44c enables electric potential of the grounding point GND to be further stabilized, this electric potential being the cathode electric potential of the temperature sensing part 13.

Further, the barrier metal 44c may be partially provided between the cathode pad 23b' and the n-type poly-silicon layer 82 of the temperature sensing part 13. In other words, the cathode pad 23b' and the n-type poly-silicon layer 82 of the temperature sensing part 13 may be electrically connected at portions thereof (first area of a contact area in which the cathode pad 23b' and the n-type poly-silicon layer 82 are electrically connected) via the barrier metal 44c, while other portions thereof (second area of the contact area) may be in direct contact. In this case, for example, as depicted in FIG. 14, along a side wall (bold-lined circle) of the fourth contact hole 83b having a circular planar shape, the Ti film 42c may be disposed and the TiN film 43c may be disposed concentrically inside the Ti film 42c. As a result, at a portion (the first area of the contact area) along the side wall of the fourth contact hole 83b, the n-type poly-silicon layer 82 and the cathode pad 23b' are electrically connected to each other via the barrier metal 44c; and inside the TiN film 43c (the second area of the contact area), the n-type poly-silicon layer 82 and the cathode pad 23b' are in direct contact with each other. In this manner, the barrier metal 44c is partially disposed in the fourth contact hole 83b, thereby enabling the electric potential of the grounding point GND to be stabilized at the portions of the n-type poly-silicon layer 82 and the cathode pad 23b' electrically connected to each other via the barrier metal 44c. Additionally, at the portions of the n-type poly-silicon layer 82 and the cathode pad 23b' in direct contact with each other, the adhesiveness of the n-type poly-silicon layer 82 and the cathode pad 23b' may be improved.

As described above, according to the third embodiment, the cathode pad and the n-type poly-silicon layer of the temperature sensing part are electrically connected to each other via the barrier metal, thereby enabling the grounding-point electric potential, which is the cathode electric potential of the temperature sensing part, to be stabilized.

In the foregoing, the present invention may be variously modified within a range not departing from the spirit of the invention. For example, in the embodiments described above, while a case in which the barrier metal has a 2-layer structure that includes a Ti film and a TiN film is described as an example, the metal and the number of layers constituting the barrier metal may be variously changed. Further, without limitation to a case in which the main semiconductor element is a trench-gate MOSFET, the present invention is further applicable in a case of a planar-gate MOSFET.

Further, in the embodiments, while an epitaxial substrate is used in which a silicon carbide layer is formed on a starting substrate by epitaxial growth, without limitation hereto, all regions constituting the semiconductor device, for example, may be formed by ion implantation in the semiconductor substrate that contains silicon carbide. Further, the present invention is further applicable to a wide bandgap semiconductor material (for example, gallium (Ga), etc.) other than silicon carbide. The present invention is further implemented when conductivity types (n-type, p-type) are reversed.

The semiconductor device according to the present invention is a semiconductor device that includes a circuit part constituted by a poly-silicon layer provided on the same semiconductor substrate as the main semiconductor element and enables the adhesiveness of the electrode pad and the poly-silicon layer constituting the circuit part to be improved, thereby achieving an effect in that contact failure of the circuit part may be suppressed.

As described, the semiconductor device according to the present invention is useful for semiconductor devices that have a circuit part constituted by a poly-silicon layer on the same semiconductor substrate as the main semiconductor element, and is particularly suitable for semiconductor devices that have as the circuit part constituted by the poly-silicon layer, a temperature sensing part constituted by a poly-silicon diode.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A semiconductor device, comprising:
   a semiconductor substrate of a first conductivity type including a semiconductor material having a bandgap that is wider than that of silicon;
   a second-conductivity-type region of a second conductivity type provided in a surface layer of a first main surface of the semiconductor substrate;
   a barrier metal disposed on the second-conductivity-type region;
   an insulated-gate field effect transistor with a trench gate structure, including a base region and a source pad, the base region comprising the second-conductivity-type region, the source pad being electrically connected to the second-conductivity-type region via the barrier metal;
   an insulating layer disposed on the semiconductor substrate;
   a second-conductivity-type poly-silicon layer of the second conductivity type provided on the first main surface of the semiconductor substrate, via the insulating layer;
   a first-conductivity-type poly-silicon layer of the first conductivity type provided on the first main surface of the semiconductor substrate next to the second-conductivity-type poly-silicon layer, via the insulating layer, a side face of the first-conductivity-type poly-silicon layer being in contact with a side face of the second-conductivity-type poly-silicon layer; and
   a diode formed by a pn junction between the second-conductivity-type poly-silicon layer and the first-conductivity-type poly-silicon layer, the diode including an anode pad and a cathode pad, the anode pad being electrically connected to and in direct contact with the second-conductivity-type poly-silicon layer, the cathode pad being electrically connected to the first-conductivity-type poly-silicon layer, wherein
   the source pad is a metal film containing aluminum as a main constituent,
   the anode pad is a metal film containing aluminum as a main constituent, the metal film of the anode pad being made of a single layer, being in direct contact with the second-conductivity-type poly-silicon layer and being free of any barrier metal,
   the cathode pad is a metal film containing aluminum as a main constituent, the metal film of the cathode pad being made of a single layer, being in direct contact with the first-conductivity-type poly-silicon layer and being free of any barrier metal, and
   the source pad is apart from the anode pad and the cathode pad in a plan view of the semiconductor device.

2. The semiconductor device according to claim 1, wherein the barrier metal is any one of a titanium film, a titanium nitride film, and a stacked film of the titanium film and the titanium nitride.

3. The semiconductor device according to claim 1, wherein
   the cathode pad is grounded, and
   the diode detects a temperature of the insulated-gate field effect transistor using temperature characteristics of the insulated-gate field effect transistor.

4. A semiconductor device, comprising:
   a semiconductor substrate of a first conductivity type including a semiconductor material having a bandgap that is wider than that of silicon;
   a second-conductivity-type region of a second conductivity type provided in a surface layer of a first main surface of the semiconductor substrate;
   a barrier metal disposed on the second-conductivity-type region;
   an insulated-gate field effect transistor with a trench gate structure, including a base region and a source pad, the base region comprising the second-conductivity-type region, the source pad being electrically connected to the second-conductivity-type region via the barrier metal;
   an insulating layer disposed on the semiconductor substrate; and
   one or more circuit parts for protecting or controlling the insulated-gate field effect transistor, the one or more circuit parts being provided on the semiconductor substrate and including:
      a poly-silicon layer provided on the first main surface of the semiconductor substrate via the insulating layer, and
      an electrode pad electrically connected to and in direct contact with the poly-silicon layer, wherein
   the source pad is a metal film containing aluminum as a main constituent,
   the electrode pad is a metal film containing aluminum as a main constituent, the metal film of the electrode pad being made of a single layer, being in direct contact with the poly-silicon layer and being free of any barrier metal, and
   the source pad is apart from the electrode pad in a plan view of the semiconductor device.

5. A semiconductor device, comprising:
a semiconductor substrate of a first conductivity type including a semiconductor material having a bandgap that is wider than that of silicon;
a second-conductivity-type region of a second conductivity type provided in a surface layer of a first main surface of the semiconductor substrate;
a barrier metal disposed on the second-conductivity-type region;
an insulated-gate field effect transistor with a trench gate structure having a gate electrode, including a base region, a source pad and a gate pad, the base region comprising the second-conductivity-type region, the source pad being electrically connected to the second-conductivity-type region via the barrier metal, the gate pad being electrically connected to the gate electrode;
an insulating layer disposed on the semiconductor substrate;
a second-conductivity-type poly-silicon layer of the second conductivity type provided on the first main surface of the semiconductor substrate, via the insulating layer;
a first-conductivity-type poly-silicon layer of the first conductivity type provided on the first main surface of the semiconductor substrate next to the second-conductivity-type poly-silicon layer, via the insulating layer, a side face of the first-conductivity-type poly-silicon layer being in contact with a side face of the second-conductivity-type poly-silicon layer; and
a diode formed by a pn junction between the second-conductivity-type poly-silicon layer and the first-conductivity-type poly-silicon layer, the diode including an anode pad and a cathode pad, the anode pad being electrically connected to and in direct contact with the second-conductivity-type poly-silicon layer, the cathode pad being electrically connected to the first-conductivity-type poly-silicon layer, wherein
the source pad is a metal film containing aluminum as a main constituent,
the anode pad is a metal film containing aluminum as a main constituent, the metal film of the anode pad being made of a single layer, being in direct contact with the second-conductivity-type poly-silicon layer and being free of any barrier metal, and
the gate pad is apart from the anode pad and the cathode pad in a plan view of the semiconductor device.

6. The semiconductor device according to claim 5, wherein the source pad is in direct contact with the first-conductivity-type poly-silicon layer and configures the cathode pad.

7. The semiconductor device according to claim 5, wherein the source pad is connected to the first-conductivity-type poly-silicon layer via the barrier metal and configures the cathode pad.

8. The semiconductor device according to claim 7, wherein
the cathode pad and the first-conductivity-type poly-silicon layer are electrically connected to each other at a contact area, the contact area including a first area and a second area,
the barrier metal is disposed between the cathode pad and the first-conductivity-type poly-silicon layer within the first area, so that the cathode pad and the first-conductivity-type poly-silicon layer are connected to each other at the first area via the barrier metal, and
the cathode pad and the first-conductivity-type poly-silicon layer are in direct contact with each other at the second area.

* * * * *